(12) United States Patent
Shiraishi et al.

(10) Patent No.: US 9,871,624 B2
(45) Date of Patent: Jan. 16, 2018

(54) TRANSMISSION APPARATUS AND RETRY METHOD

(71) Applicant: FUJITSU LIMITED, Kawasaki-shi, Kanagawa (JP)

(72) Inventors: Hiroaki Shiraishi, Fukutsu (JP); Tateo Shimaru, Fukuoka (JP); Naoyuki Takeshita, Fukuoka (JP); Katsuhiko Hirashima, Kurume (JP); Masaru Nishida, Fukuoka (JP); Tsuneharu Suzuki, Fukuoka (JP); Hisaya Urabe, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/244,196

(22) Filed: Aug. 23, 2016

(65) Prior Publication Data

US 2017/0063496 A1    Mar. 2, 2017

(30) Foreign Application Priority Data

Aug. 28, 2015 (JP) ................................ 2015-169715

(51) Int. Cl.
*G06F 11/00* (2006.01)
*H04L 1/08* (2006.01)
*G06F 13/40* (2006.01)
*G06F 11/07* (2006.01)

(52) U.S. Cl.
CPC ................ *H04L 1/08* (2013.01); *G06F 11/00* (2013.01); *G06F 11/0709* (2013.01); *G06F 13/4059* (2013.01)

(58) Field of Classification Search
CPC ................................... H04L 1/08; G06F 11/10
See application file for complete search history.

(56) References Cited

U.S. PATENT DOCUMENTS

| | | | | |
|---|---|---|---|---|
| 6,543,014 | B1 * | 4/2003 | Okuyama ............... | H04L 45/20 370/412 |
| 6,584,580 | B1 * | 6/2003 | Yamato .................. | G06F 11/008 714/10 |
| 6,665,807 | B1 * | 12/2003 | Kondo ................ | G06F 13/4059 370/236 |
| 7,243,189 | B2 * | 7/2007 | Nagasoe .................. | G06F 3/062 707/999.202 |
| 7,269,774 | B2 * | 9/2007 | Sudo ..................... | H04L 1/0021 714/704 |

(Continued)

FOREIGN PATENT DOCUMENTS

JP    2010-191569    9/2010

*Primary Examiner* — Esaw Abraham
(74) *Attorney, Agent, or Firm* — Fujitsu Patent Center

(57) ABSTRACT

A transmission apparatus includes a first storage configured to store data received from external into a write enable area, a second storage configured to store the data in accordance with a write request and output a retry request in response to occurring an error of writing a first data included in the data, and a controller configured to read the data from the first storage and send the write request to the second storage, set an area of the first storage storing the first data to a write disable area in combination with stop sending the retry request to external when receiving the retry request from the second storage, and send the first data reading from the write disable area of the first storage to external in response to a read request from external.

10 Claims, 21 Drawing Sheets

(56) References Cited

U.S. PATENT DOCUMENTS

| | | | |
|---|---|---|---|
| 7,653,060 B2* | 1/2010 | Mayhew | H04L 1/1838 370/392 |
| 8,176,357 B2* | 5/2012 | Hsu | G06F 11/0709 714/15 |
| 8,681,526 B2* | 3/2014 | Simon | G06F 5/06 365/78 |
| 8,762,775 B2* | 6/2014 | Hsu | G06F 11/0709 714/18 |
| 9,356,737 B2* | 5/2016 | Wood | H04L 1/08 |

* cited by examiner

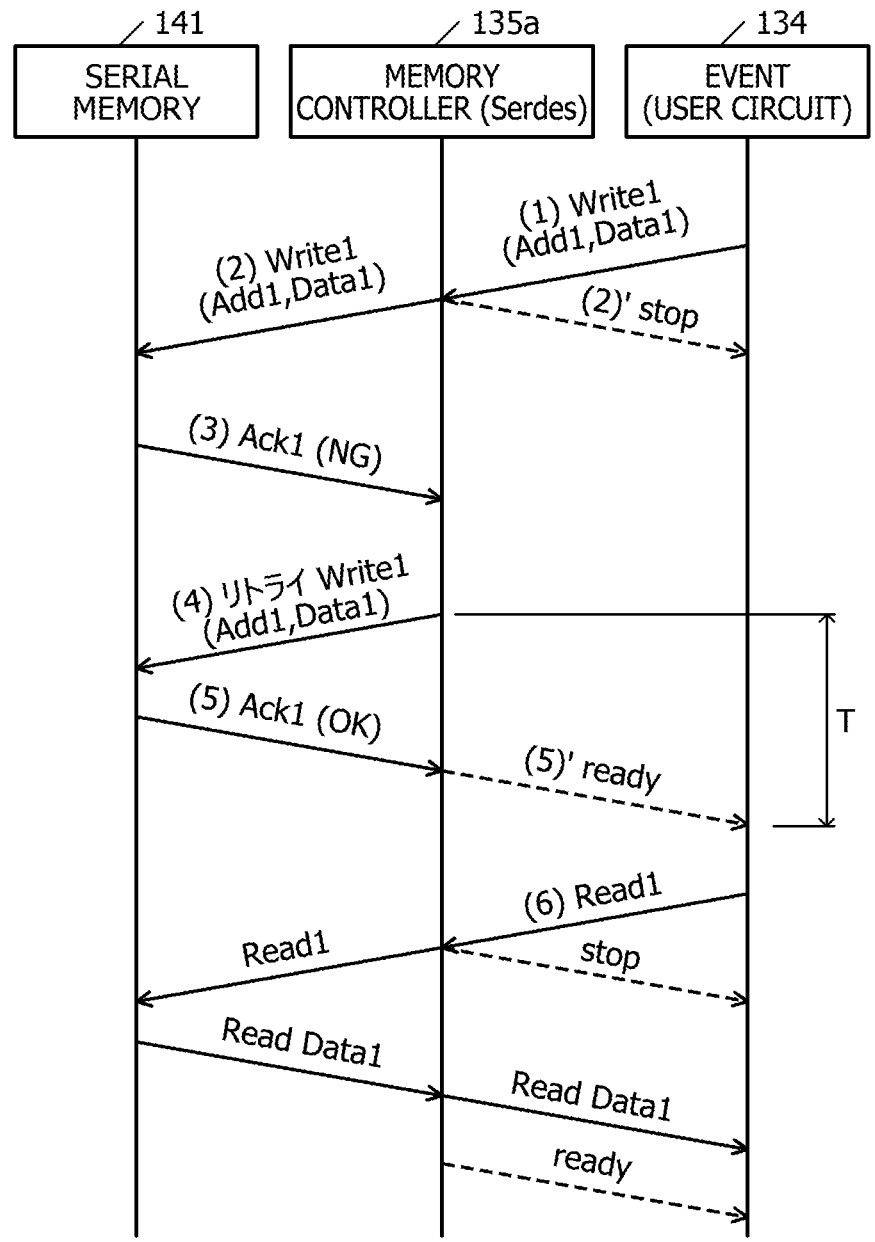

TRANSMISSION APPARATUS AND RETRY METHOD

CROSS-REFERENCE TO RELATED APPLICATION

This application is based upon and claims the benefit of priority of the prior Japanese Patent Application No. 2015-169715, filed on Aug. 28, 2015, the entire contents of which are incorporated herein by reference.

FIELD

The embodiments discussed herein are related to a transmission apparatus and a retry method for transmitting a received packet after storing the packet in a memory.

BACKGROUND

With the recent increased communication traffic, there has been a demand for a transmission apparatus achieving data communications with higher speed, larger capacity, and higher quality. To meet such demand, some transmission apparatus employs a high-speed serial memory as a memory to temporarily hold received data within the transmission apparatus. This high-speed serial memory is provided as a packet buffer in a reception unit of the transmission apparatus, for example, and is used as a memory from which data is read within a certain period of time after the data is written, even though the read order of the data changes according to the priority.

There is one using a serializer/deserializer (Serdes) transceiver as an interface of the high-speed serial memory. In the Serdes, an error occurs probabilistically (with a predetermined probability) due to noise or the like on a transmission path within the transmission apparatus. When the Serdes has an access error (write error) to the high-speed serial memory, a retry (another write processing) to the high-speed serial memory within the transmission apparatus is performed in order to reduce data loss and to ensure data quality.

Moreover, there is a technique for data transmission between apparatuses to reduce a retry frequency, by monitoring a state of a reception buffer in a reception-side apparatus, obtaining a reference time corresponding to the time of occurrence of a retry request, and controlling data read from a transmission buffer in a transmission-side apparatus.

Japanese Laid-open Patent Publication No. 2010-191569 is known as an example of prior art.

In the above prior technique, a data transmission amount between the apparatuses may not be reduced since data is transmitted between the apparatuses upon every retry.

Moreover, when the Serdes is used as a memory interface in the transmission apparatus, a retry to the serial memory is performed in the transmission apparatus upon occurrence of a write error to the high-speed serial memory. Therefore, an access band of the high-speed serial memory is occupied. When an interface speed of the Serdes is increased in response to the band occupancy, power consumption is significantly increased.

SUMMARY

According to an aspect of the invention, a transmission apparatus includes a first storage configured to store data received from external into a write enable area, a second storage configured to store the data in accordance with a write request and output a retry request in response to occurring an error of writing a first data included in the data, and a controller configured to read the data from the first storage and send the write request to the second storage, set an area of the first storage storing the first data to a write disable area in combination with stop sending the retry request to external when receiving the retry request from the second storage, and send the first data reading from the write disable area of the first storage to external in response to a read request from external.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 21 is a sequence diagram illustrating a state of band occupancy of an existing transmission apparatus.

DESCRIPTION OF EMBODIMENTS

It is an object of one aspect of embodiments to make it possible to avoid occupancy of a communication band of a memory by reducing a write retry to the memory even if a write error of a received packet into the memory occurs.

Embodiments of disclosed transmission apparatus and retry method are described in detail.

Embodiment 1

Figure 1:
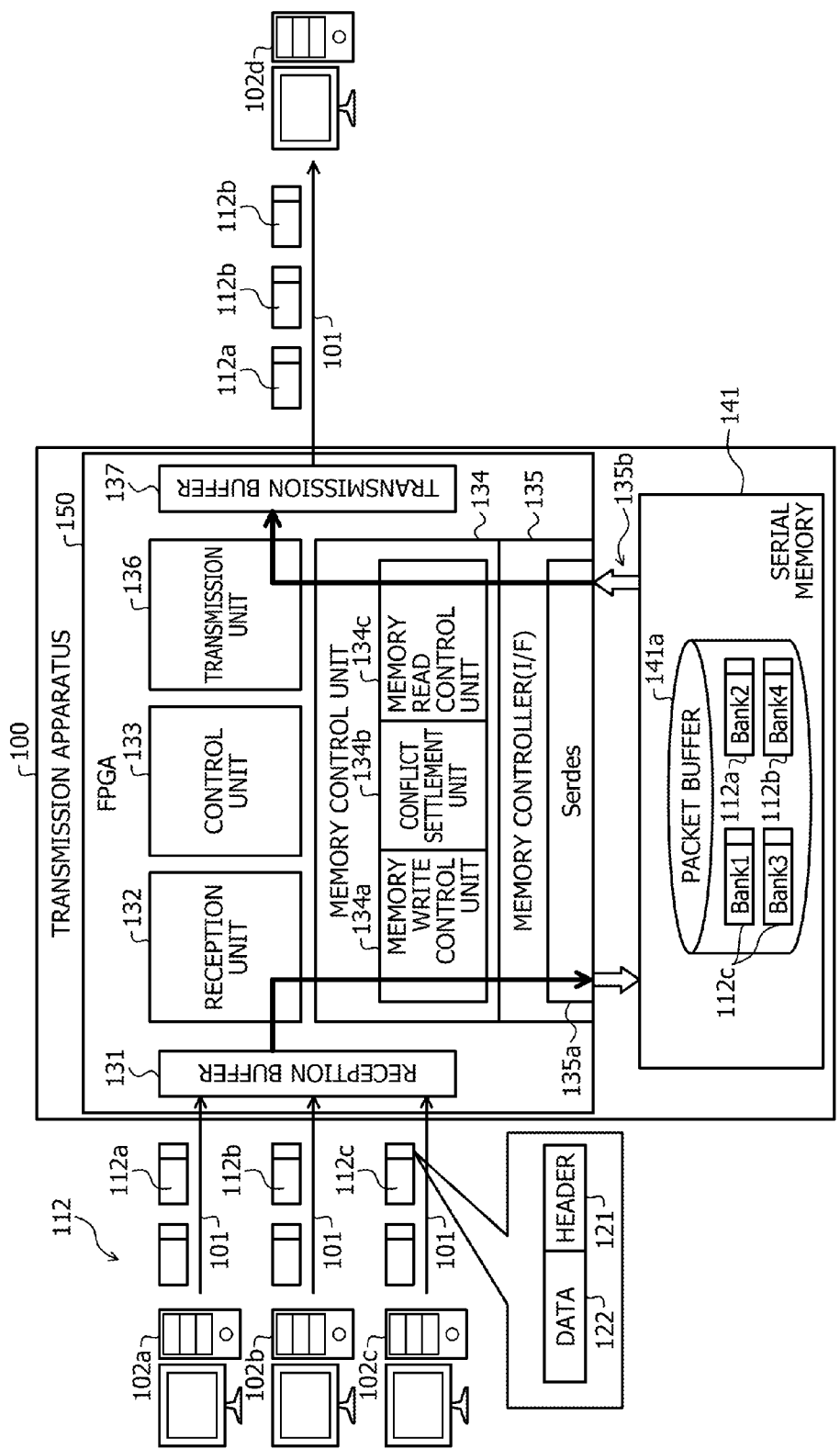
FIG. 1 is a configuration diagram illustrating a transmission apparatus according to Embodiment 1.

FIG. 1 is a configuration diagram illustrating a transmission apparatus according to Embodiment 1. A transmission apparatus 100 is connected to multiple processors 102 through transmission paths 101 such as a LAN. The example of FIG. 1 illustrates a state where the transmission apparatus 100 transmits data transmitted from three processors 102a to 102c on data transmission side to one processor 102d on data reception side. Packets described below are all data to be transferred from the processors 102 (102a to 102c) on the transmission side to the processor 102 (102d) on the reception side. The packets and the data are synonymous.

The processors 102 (102a to 102c) such as PCs on the transmission side transmit packets 112 (112a to 112c) to the transmission apparatus 100, respectively. Each of the packets 112 includes a header 121 and data 122.

The transmission apparatus 100 includes a reception buffer 131, a reception unit 132, a control unit 133, a memory control unit 134, a memory controller 135, a transmission unit 136, a transmission buffer 137, and a high-speed serial memory 141.

A field-programmable gate array (FPGA) 150 may be used for the reception buffer 131, the reception unit 132, the control unit 133, the memory control unit 134, the memory controller 135, the transmission unit 136, and the transmission buffer 137, for example.

The embodiments are not limited to the FPGA 150 but may adopt a configuration in which a CPU and a ROM, a RAM and the like are used and a control program stored in the ROM is executed by the CPU to use the RAM as a work area.

The reception buffer 131 performs buffering to temporarily accumulate a predetermined amount of packets received from the transmission-side processors 102 (102a to 102c) through the transmission paths 101, and outputs the packets to the reception unit 132. The reception unit 132 performs reception processing of the received packets, and outputs the packets to the memory control unit 134 after checking the header, ECC (OK/FAILED) and the like.

The control unit 133 controls the respective units in the transmission apparatus 100. For example, the received packets are subjected to reception processing by the reception unit 132, and are written into the serial memory 141 as a storage through the memory control unit 134. Also, the control unit 133 controls the memory control unit 134 to read the packets according to the priority for each packet from the serial memory 141, and then controls the transmission unit 136 to transmit the packets to the corresponding reception-side processor 102 (102d) after assembling the packets.

The memory control unit 134 includes a memory write control unit 134a, a conflict settlement unit 134b, and a memory read control unit 134c. The memory controller 135 controls write and read of data (packets) into and from the serial memory 141. Also, the memory controller 135 uses a Serdes 135a, for example, as an interface with the serial memory 141. 135b denotes a transmission path of the Serdes 135a within the transmission apparatus.

For example, the serial memory 141 has a transmission band (read/write rate) of 12.5 Gbps, and the transmission path 135b has a transmission rate of 10 Gbps.

In the example of FIG. 1, the serial memory 141 is used as a packet buffer 141a in which the received packets are stored and from which the packets are read upon elapse of a certain period of time after the packets are written. The packets written into the serial memory 141 (packet buffer 141a) are read in the order of read corresponding to the priority.

The memory write control unit 134a in the memory control unit 134 writes the packets subjected to the reception processing by the reception unit 132 into the serial memory 141 (packet buffer 141a) through the memory controller 135.

The conflict settlement unit 134b settles conflict between write and read of data to the serial memory 141. Also, the conflict settlement unit 134b performs control to settle a write access during a read retry to the same Bank among banks (Banks; four regions storing packets in FIG. 1) in the serial memory 141 (packet buffer 141a) and to temporarily put a write operation on standby.

The memory read control unit 134c reads the packets from the serial memory 141 (packet buffer 141a) and outputs the packets to the transmission unit 136.

The transmission unit 136 changes the header, adds ECC or the like to transmit the packets read from the serial memory 141 (packet buffer 141a) to a predetermined destination, and outputs the packets to the transmission buffer 137. The transmission buffer 137 performs buffering to temporarily accumulate a predetermined amount of packets to be transmitted, and transmits and outputs the packets onto the transmission path 101 toward the corresponding reception-side processor (the processor 102d in the example of FIG. 1) based on the headers of the packets.

In the example of FIG. 1, the transmission apparatus 100 transmits the packets in a predetermined priority order (order of the packets 112b, 112b, and 112a) to the reception-side processor 102d.

Figure 2:
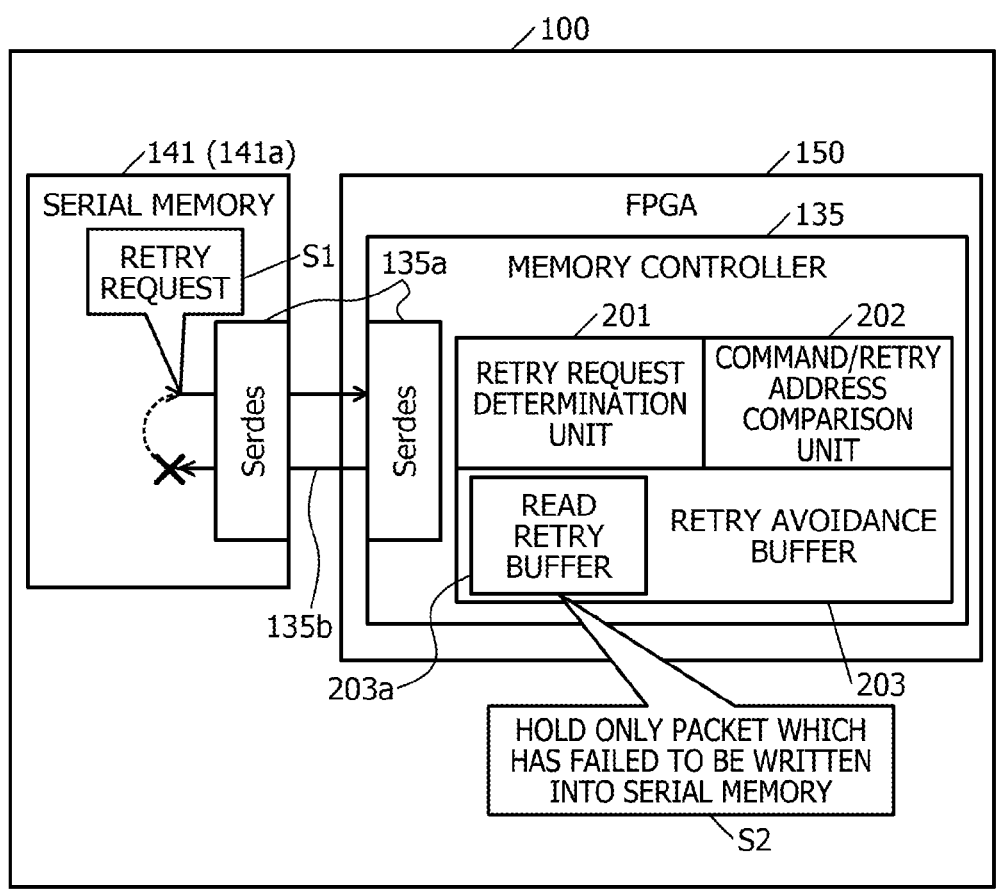
FIG. 2 is a diagram illustrating a configuration example of a memory controller part of the transmission apparatus according to Embodiment 1.

FIG. 2 is a diagram illustrating a configuration example of a memory controller part of the transmission apparatus according to Embodiment 1. FIG. 2 illustrates the memory controller 135 part extracted from the configuration illustrated in FIG. 1. The Serdes 135a is provided as an IF circuit on each of the memory controller 135 side and the serial memory 141 side across the transmission path 135b.

The transmission apparatus 100 according to Embodiment 1 has an additional function to the memory controller 135. The memory controller 135 includes a retry request determination unit 201, a command/retry address comparison unit 202, and a retry avoidance buffer 203. The command/retry address comparison unit 202 and the retry avoidance buffer 203 are added as new functions.

The retry avoidance buffer 203 functions as a temporary storage to temporarily store and hold packets (data and address information) to be written into the serial memory 141. The data temporarily stored in the retry avoidance buffer 203 is deleted when the packets are normally written into the serial memory 141. The read retry buffer 203a stores and holds information such as address for retry to read the data from the retry avoidance buffer 203 during a retry.

The retry request determination unit 201 determines whether or not there is a retry request to the serial memory 141. The command/retry address comparison unit 202 searches for the same address in the retry avoidance buffer 203 upon issuance of a read request. Then, based on the search result, data is read from the serial memory 141 when there is no same address, and data is read from the retry avoidance buffer 203 when there is the same address.

When an error occurs and a retry request S1 is returned during the write access to the serial memory 141, the memory controller 135 holds the relevant address and data in the retry avoidance buffer 203 and does not execute a write retry to the serial memory 141. The retry avoidance buffer 203 holds only the packets which have failed to be written into the serial memory 141 (S2).

When a read request is issued from a user circuit in response to occurrence of an event, the retry request determination unit 201 causes the command/retry address comparison unit 202 to search for the same address in the retry avoidance buffer 203.

The user circuit is a circuit for reading and writing data to the serial memory 141, which corresponds to the memory control unit 134 (the memory write control unit 134a and the memory read control unit 134c) in the above configuration example.

Then, when there is no same address in the retry avoidance buffer 203, the retry request determination unit 201 issues a read to the serial memory 141. On the other hand, when there is the same address in the retry avoidance buffer 203, the retry request determination unit 201 returns the read data read from the retry avoidance buffer 203 to the user circuit without issuing any read to the serial memory 141.

When the Serdes 135a is used in the memory controller 135, a write error occurs probabilistically in the serial memory 141 due to noise or the like on the transmission path. However, according to the above configuration, retries to the serial memory 141 may be reduced, thus enabling operation of the serial memory 141 without occupying the communication band to the serial memory 141.

The serial memory 141 is a packet buffer holding received data, and is a memory from which packets are read upon elapse of a certain period of time after the packets are written, even though the read order changes according to the priority.

Figure 3:
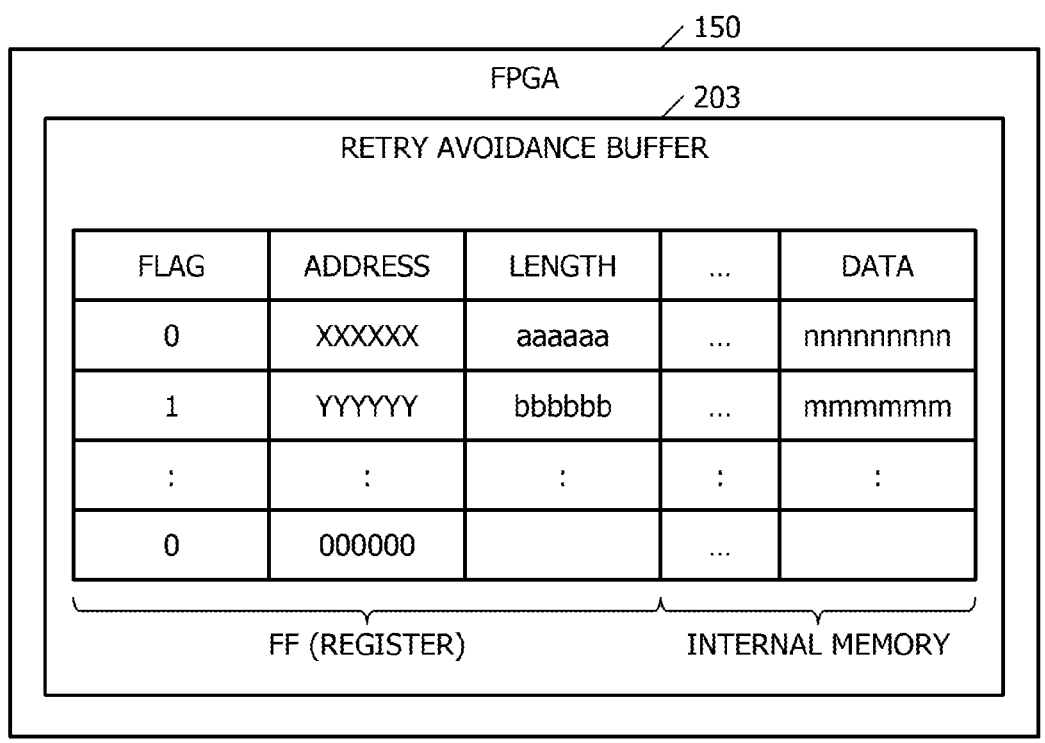
FIG. 3 is a diagram illustrating a configuration example of a retry avoidance buffer used in the transmission apparatus according to Embodiment 1.

FIG. 3 is a diagram illustrating a configuration example of the retry avoidance buffer used in the transmission apparatus according to Embodiment 1. The retry avoidance buffer 203 may have various configurations, and an example thereof is illustrated in FIG. 3. Flags, addresses, and lengths of data are stored in FF (register), while data is stored in an internal memory in the retry avoidance buffer 203.

In the event of a data write to the retry avoidance buffer 203, data is basically added to the stored data (additionally written into a region after the final address). In this event, an address and the length of data are stored in a region having "0" as the value of a flag. When the data is stored, the flag is set to "1". The presence or absence of data in the retry avoidance buffer 203 is managed using the flag. Also, when the data is deleted from the retry avoidance buffer 203, the flag of the corresponding address is only changed to "0". Thus, the processing of deleting the data itself may be reduced. Thus, the flag indicates a write enable area when the flag is "0", and the flag indicates a write disable area when the flag is "1".

As described above, when the serial memory 141 is used as the packet buffer, the capacity of the retry avoidance buffer 203 (the number of frames in the vertical direction in FIG. 3) may be set to about error occurrence rate+margin within a predetermined maximum read time.

Figure 4:
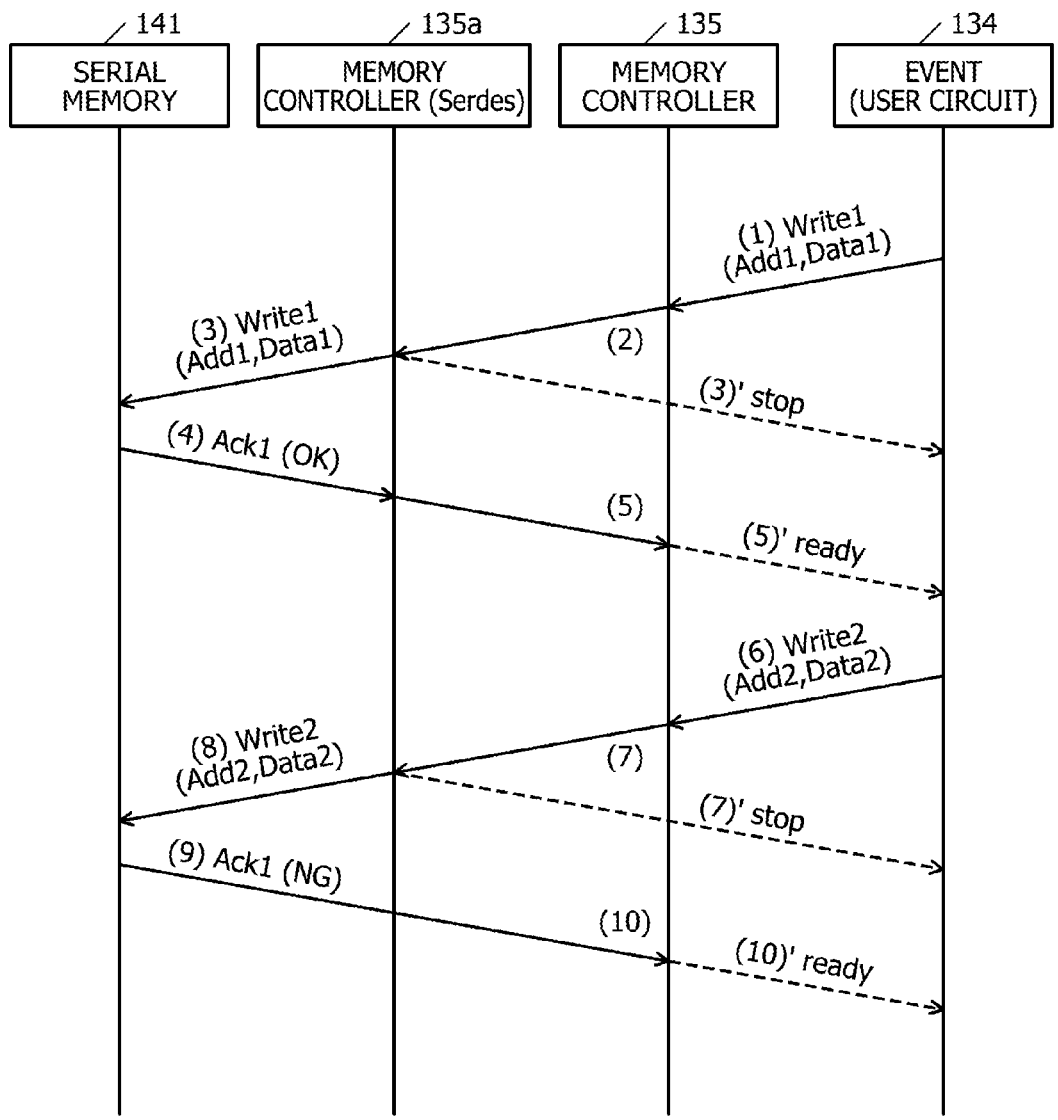
FIG. 4 is a sequence diagram illustrating a processing example of respective units during a data write in the transmission apparatus according to Embodiment 1.

FIG. 4 is a sequence diagram illustrating a processing example of the respective units during a data write in the transmission apparatus according to Embodiment 1. In the event of a write request of data, the memory controller 135 and the serial memory 141 perform the following processing.

First, description is given of processing when a data write to the serial memory 141 is successfully performed.

(1) A write request (Write1) as an event of the user circuit (memory control unit 134) is transmitted to the memory controller 135 and the Serdes 135a.

(2) The memory controller 135 stores an address (Add1) and data (Data1) of Write1 in the retry avoidance buffer 203.

(3) The memory controller 135 issues a write command (Write1) to the serial memory 141.

(3)' The memory controller 135 also restricts (Stop) access to the user circuit 134.

(4) When the serial memory 141 has successfully performed the data write, OK (Ack1 (positive)) is returned to the memory controller 135. The serial memory 141 performs ECC check to determine if the data write has been successful or failed.

(5) Since the serial memory 141 has successfully performed the data write, the memory controller 135 deletes the corresponding address (Add1) and data (Data1) in the retry avoidance buffer 203.

(5)' The memory controller 135 permits access to the user circuit 134 (ready).

Next, description is given of processing upon failure of a data write to the serial memory 141.

(6) A write request (Write2) as an event is transmitted to the memory controller 135 and the Serdes 135a.

(7) The memory controller 135 stores an address (Add2) and data (Data2) of Write2 in the retry avoidance buffer 203.

(8) The memory controller 135 issues a write command (Write2) to the serial memory 141.

(8)' The memory controller 135 also restricts (Stop) access to the user circuit 134.

(9) When the data write to the serial memory 141 fails, write failure (Ack1 (NG)) is returned to the memory controller 135.

(10) Since the data write to the serial memory 141 has failed, the memory controller 135 does not do anything to (does not delete) the corresponding address (Add1) and data (Data1) in the retry avoidance buffer 203.

(10)' The memory controller 135 permits access to the user circuit 134 (ready).

As described above, upon failure of the data write to the serial memory 141, the address (Add2) and data (Data2) of Write2 are stored in the retry avoidance buffer 203.

Figure 5:
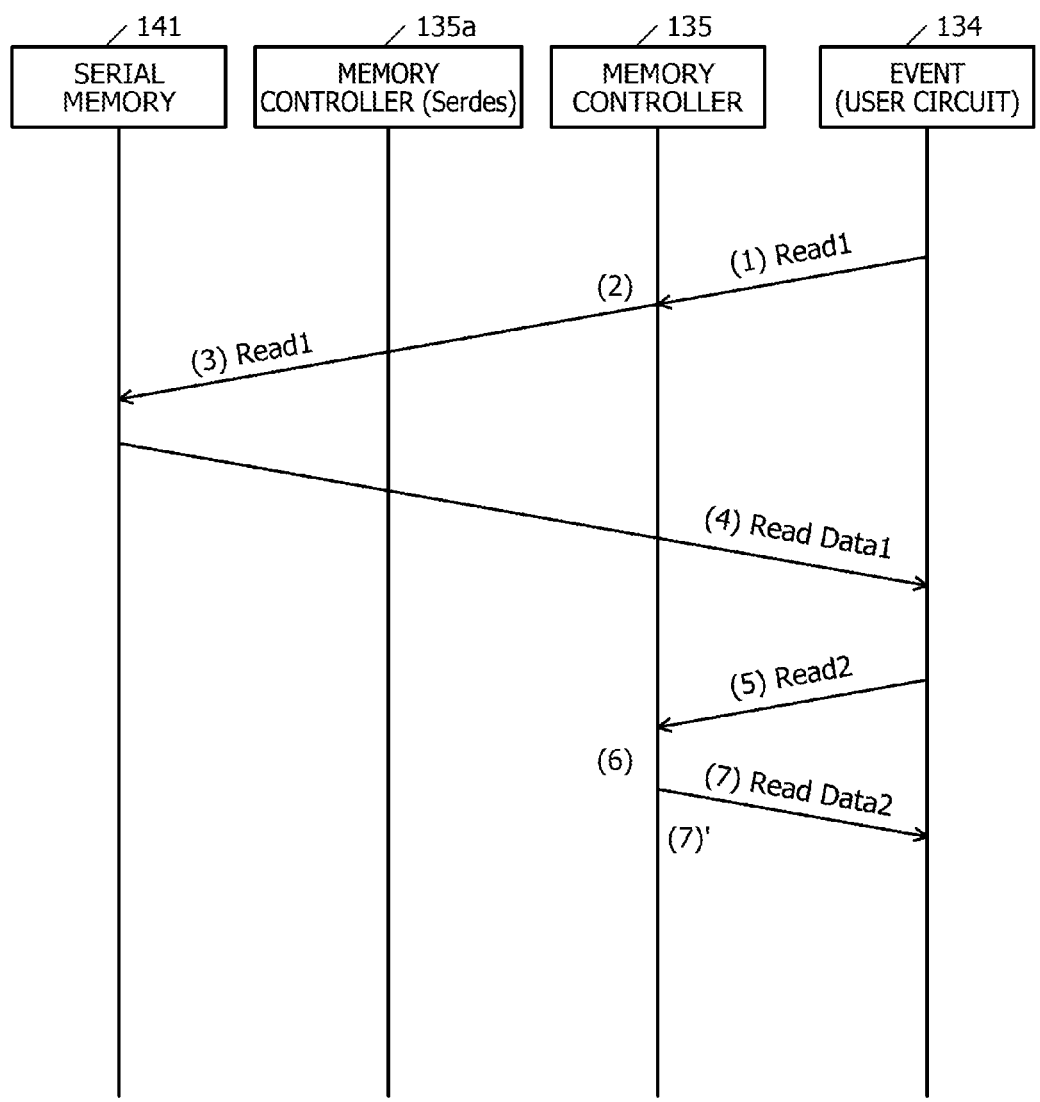
FIG. 5 is a sequence diagram illustrating a processing example of the respective units during a data read in the transmission apparatus according to Embodiment 1.

FIG. 5 is a sequence diagram illustrating a processing example of the respective units during a data read in the transmission apparatus according to Embodiment 1. In the event of a read request of data, the memory controller 135 and the serial memory 141 perform the following processing.

First, description is given of data read processing after the processing (1) to (5)' when the data write to the serial memory 141 has been successful in FIG. 4 described above.

(1) A read request (Read1) as an event is transmitted to the memory controller 135.

(2) An address of a read target (Read1) is compared with an address in the retry avoidance buffer 203.

(3) When the addresses do not correspond as a result of the comparison, a read request (Read1) is issued to the serial memory 141.

(4) Data (ReadData1) read from the serial memory 141 is returned to the user circuit 134.

As described above, when the data write to the serial memory 141 has been successful, there is no data in the retry avoidance buffer 203, and the memory controller 135 reads data from the serial memory 141.

Next, with reference to FIG. 5 (processing (5) to (7)'), description is given of data read processing after the processing (6) to (9)' upon failure of the data write to the serial memory 141 in FIG. 4 described above.

(5) A read request (Read2) from the user circuit 134 is transmitted to the memory controller 135.

(6) An address of a read target (Read1) is compared with an address in the retry avoidance buffer 203.

(7) When the addresses correspond as a result of the comparison, corresponding data (ReadData2) in the retry avoidance buffer 203 is read and returned to the user circuit 134.

(7)' The memory controller 135 deletes corresponding address and data of the data (ReadData2) read from the retry avoidance buffer 203.

As described above, when the date write to the serial memory 141 has failed, data is written and held in the retry avoidance buffer 203, and the memory controller 135 reads data from the serial memory 141.

According to the above processing, data in which a write error has occurred during the write processing of the received packet into the serial memory 141 is left in the retry avoidance buffer 203. Then, during the read processing, an address comparison is made to check if there is an address of data to be read is in the retry avoidance buffer 203. If the address is in the retry avoidance buffer 203, the same data may be read from the retry avoidance buffer 203 without access (retry) to the serial memory 141.

FIGS. 6 to 12 are flowcharts each illustrating a data processing content example in the transmission apparatus according to Embodiment 1.

(Processing Example During Data Write)

Figure 6:
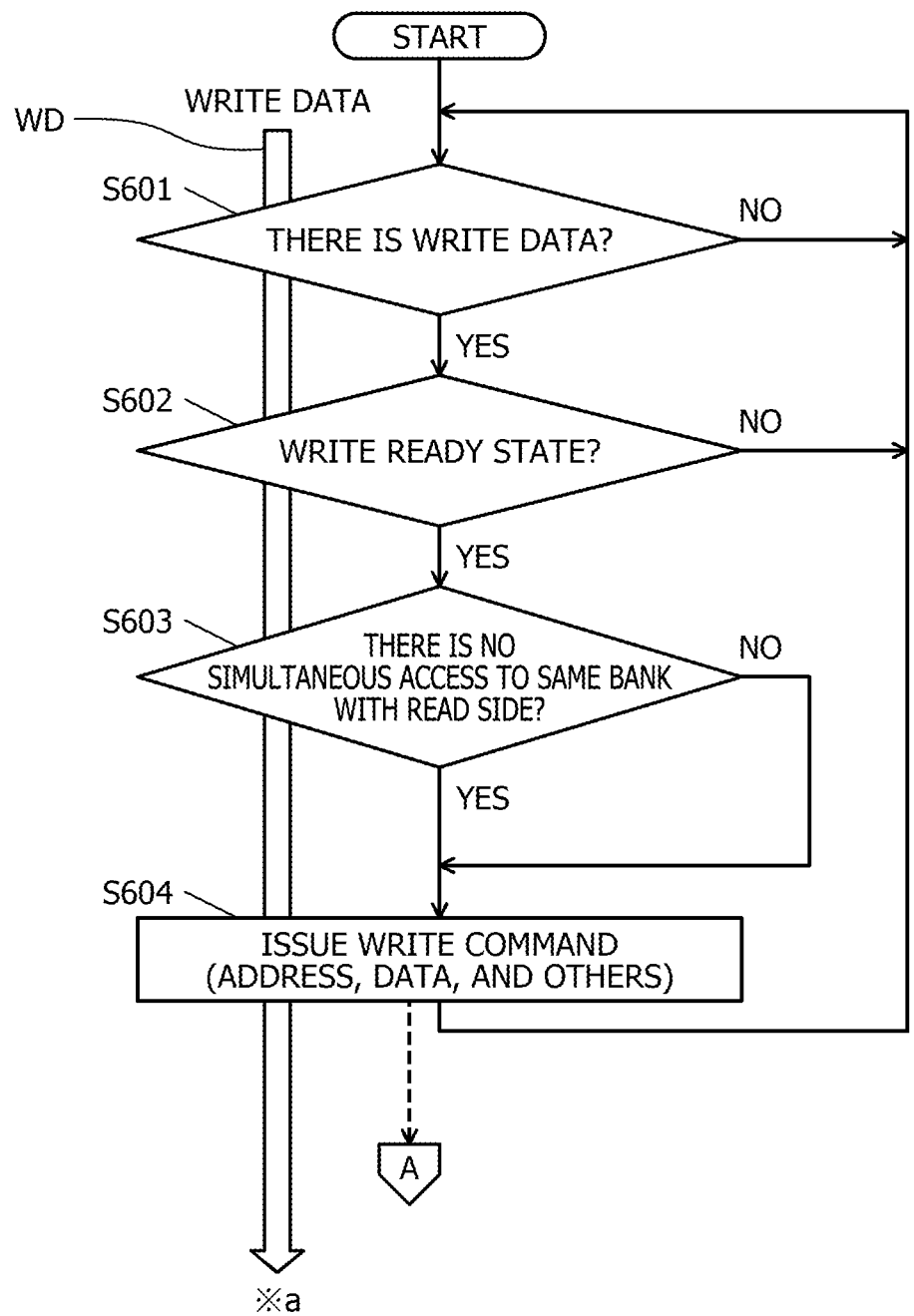
FIG. 6 is a flowchart illustrating a data processing content example in the transmission apparatus according to Embodiment 1 (Processing Part 1 during write)
Figure 7:
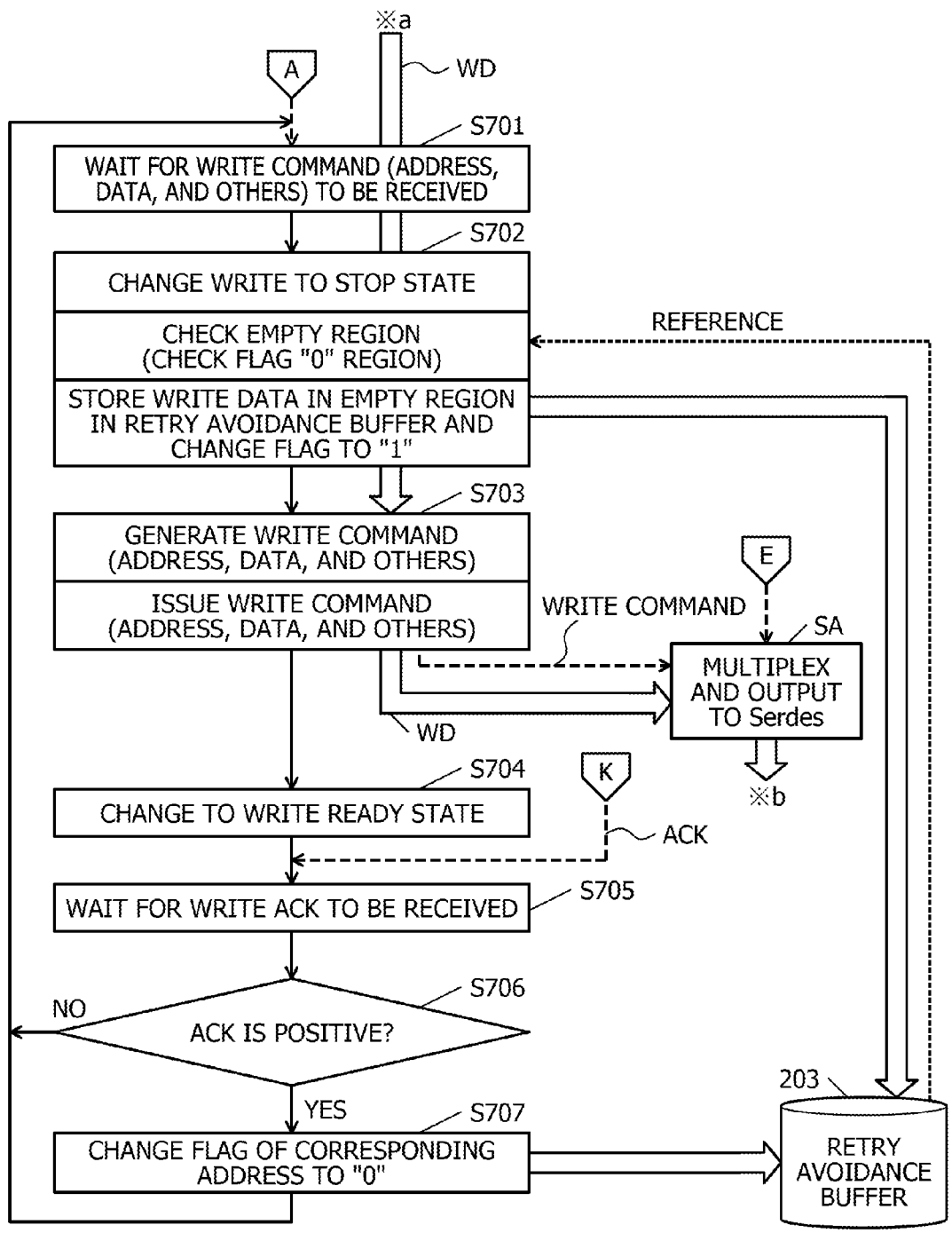
FIG. 7 is a flowchart illustrating a data processing content example in the transmission apparatus according to Embodiment 1 (Processing Part 2 during write)
Figure 8:
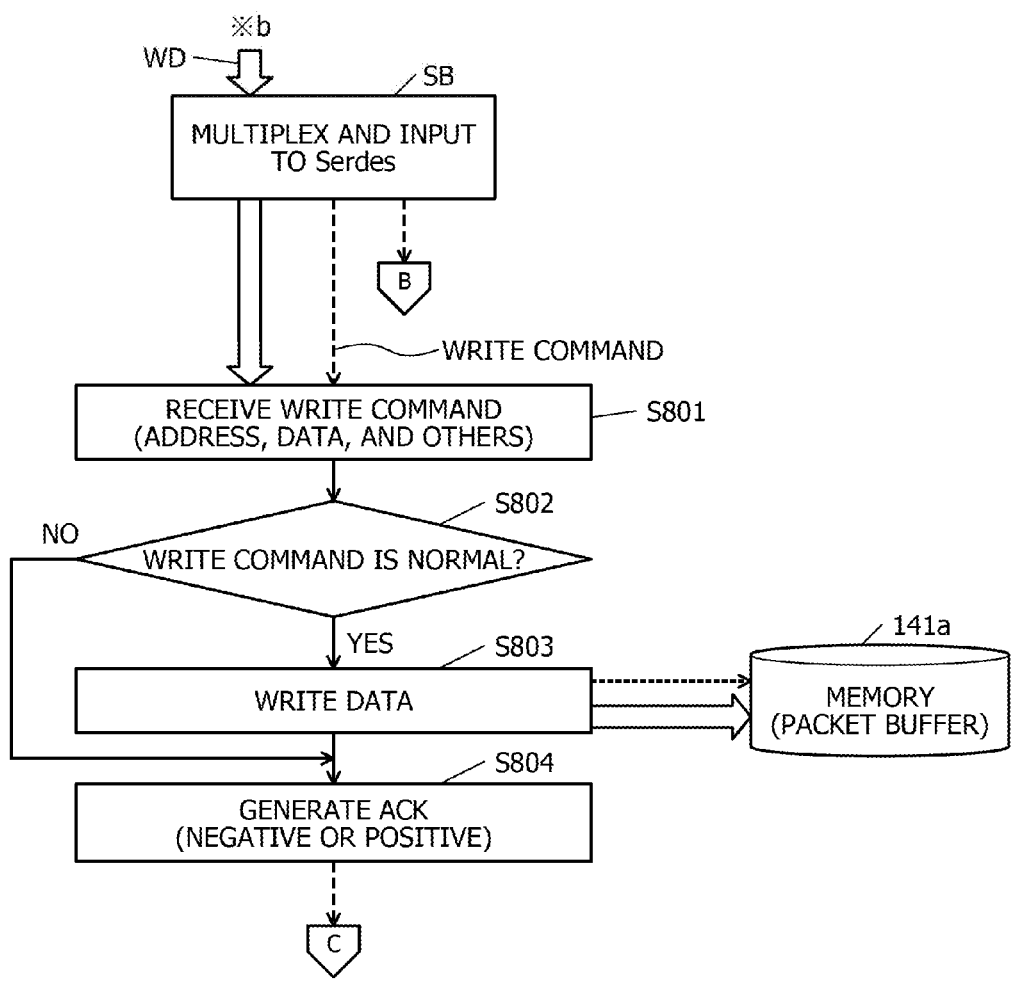
FIG. 8 is a flowchart illustrating a data processing content example in the transmission apparatus according to Embodiment 1 (Processing Part 3 during write)

First, with reference to FIGS. 6 to 8, detailed description is given of processing contents during data write. FIGS. 6 to 8 also each illustrate the flow of write data WD.

First, FIG. 6 illustrates processing performed by the write control unit 134a in the memory control unit 134 that is the user circuit. The user circuit 134 determines whether or not there is write data (S601). If there is no write data (S601: No loop), the memory control unit 134 waits for input of write data. On the other hand, if there is write data (S601: Yes), it is determined based on a status flag or the like in the retry avoidance buffer 203 whether the data may be written into the serial memory 141 (ready state) (S602).

If the data write is not in the ready state (S602: No), the memory control unit 134 returns to S601. On the other hand, if the data write is in the ready state (S602: Yes), the conflict settlement unit 134b determines if there is no simultaneous access to the same Bank with the read side (S603).

In Embodiment 1, the conflict settlement unit 134b is set to give priority to write processing over read processing. Thus, the processing moves to S604 in any case regardless of the determination result (S603: Yes/No) in S603.

In S604, the user circuit issues a write command (address, data, and others) (S604).

After the processing by the user circuit (memory control unit 134) illustrated in FIG. 6 described above, the memory controller 135 executes processing illustrated in FIG. 7. First, the memory controller 135 waits for a write command (address, data, and others) to be received (S701).

Upon receipt of the write command, the memory controller 135 changes the write status flag in the retry avoidance buffer 203 to a Stop state. Also, the memory controller 135 checks an empty region (region with the flag "0" in FIG. 3), stores write data WD in the empty region, and changes the flag of the region storing the write data to "1" (S702).

Next, the memory controller 135 generates a write command (address, data, and others) to the serial memory 141, and issues the write command (S703). Thus, the write data WD is multiplexed and outputted to the Serdes 135a on the memory controller 135 side (SA).

Thereafter, the memory controller 135 changes the write status flag in the retry avoidance buffer 203 to a ready state (S704), and waits for a write ACK to be received from the serial memory 141 (S705).

Then, the memory controller 135 determines whether or not the write ACK received from the serial memory 141 is positive (S706). If the write ACK is positive (S706: Yes), the write of the write data WD into the serial memory 141 is successfully completed, and the flag of the corresponding address in the write data WD stored in the retry avoidance buffer 203 is changed to "0" (S707). Then, the processing returns to S701.

On the other hand, if the write ACK is not positive but is negative (S706: No), the processing returns to S701. In this case, the flag of the corresponding address in the write data WD in the retry avoidance buffer 203 remains as "1", and the write data WD is held in the retry avoidance buffer 203.

After the processing by the memory controller 135 illustrated in FIG. 7 described above, the serial memory 141 executes processing illustrated in FIG. 8. First, the write data WD is multiplexed and inputted to the Serdes 135a on the serial memory 141 side (SB), and the serial memory 141 receives a write command (address, data, and others) (S801).

Then, the serial memory 141 determines whether or not the write command is normal (S802). If the write command is normal (S802: Yes), the serial memory 141 writes the write data WD into the memory (packet buffer 141a) (S803), and generates a positive ACK (S804).

On the other hand, if the write command is not normal (S802: No), the serial memory 141 generates a negative ACK (S804) without performing the data write in S803. The generated ACK is transmitted to the memory controller 135 (for the processing of S706 in FIG. 7). Note that the ACK is transmitted to the memory controller 135 through the Serdes 135a (see FIG. 12 and the like for the route).

(Processing Example During Data Read)

Next, with reference to FIGS. 9 to 12, detailed description is given of processing contents during data read. FIGS. 9 to 12 also each illustrate the flow of read data RD.

Figure 9:
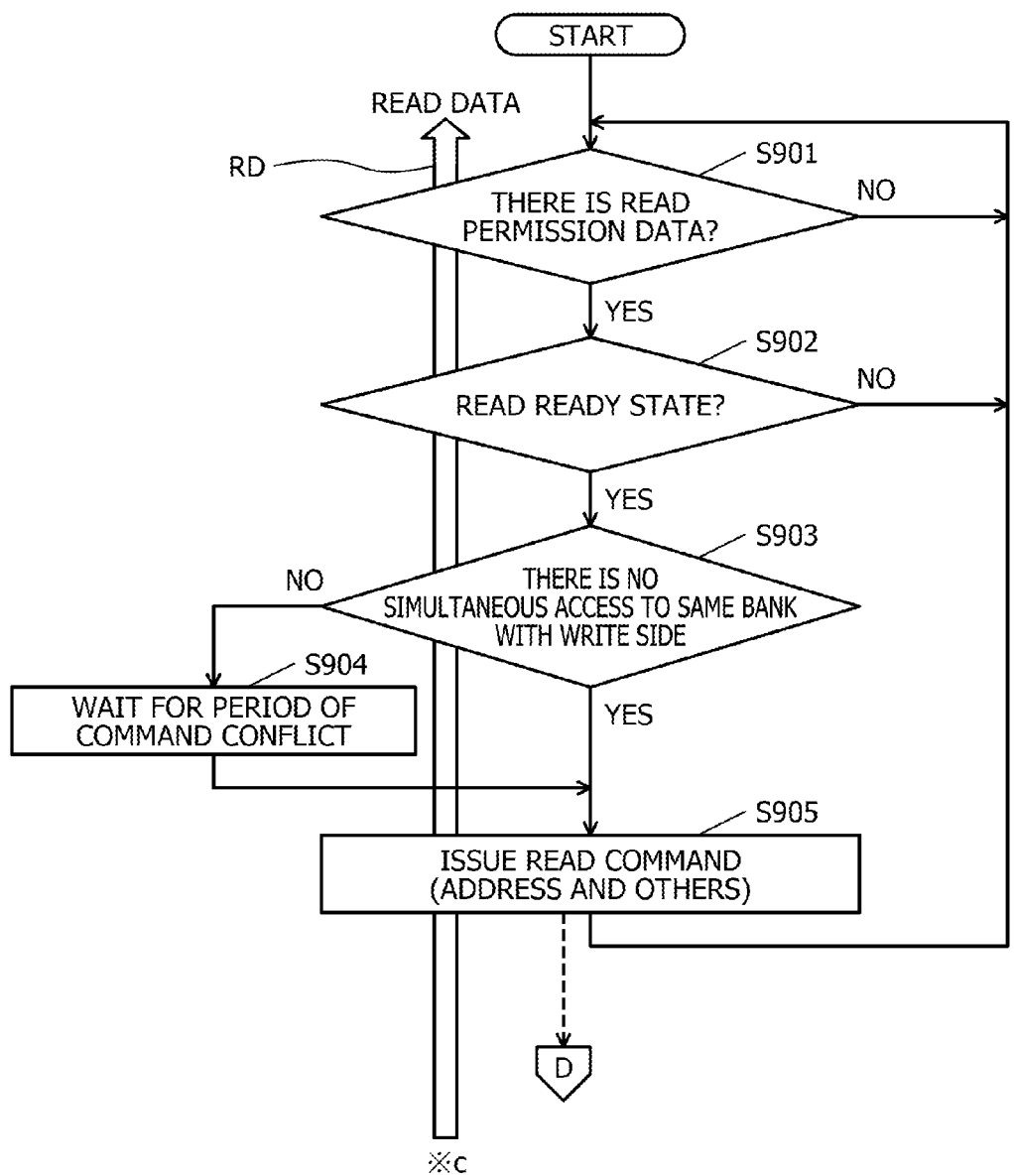
FIG. 9 is a flowchart illustrating a data processing content example in the transmission apparatus according to Embodiment 1 (Processing Part 1 during read)

First, FIG. 9 illustrates processing performed by the read control unit 134c in the memory control unit 134 that is the user circuit. The user circuit determines whether or not there is read permission data (S901). If there is no read permission data (S901: No loop), the memory control unit 134 waits for input of read permission. On the other hand, if there is read permission data (S901: Yes), it is determined based on a status flag or the like in the retry avoidance buffer 203 whether the read data RD may be read from the serial memory 141 (ready state) (S902).

If the data read is not in the ready state (S902: No), the memory control unit 134 returns to S901. On the other hand, if the data read is in the ready state (S902: Yes), the conflict settlement unit 134b determines if there is no simultaneous access to the same Bank with the write side (S903).

As described above, in Embodiment 1, the conflict settlement unit 134b is set to give priority to write processing over read processing. Thus, if there is simultaneous access to the same Bank with the write side during the read as a result of the determination in S903 (S903: No), the processing moves to S905 after waiting for read for a period corresponding to a command conflict (S904).

If there is no simultaneous access to the same Bank with the write side during the read as a result of the determination in S903 (S903: Yes), the user circuit issues a read command (address and others) (S905).

Figure 10:
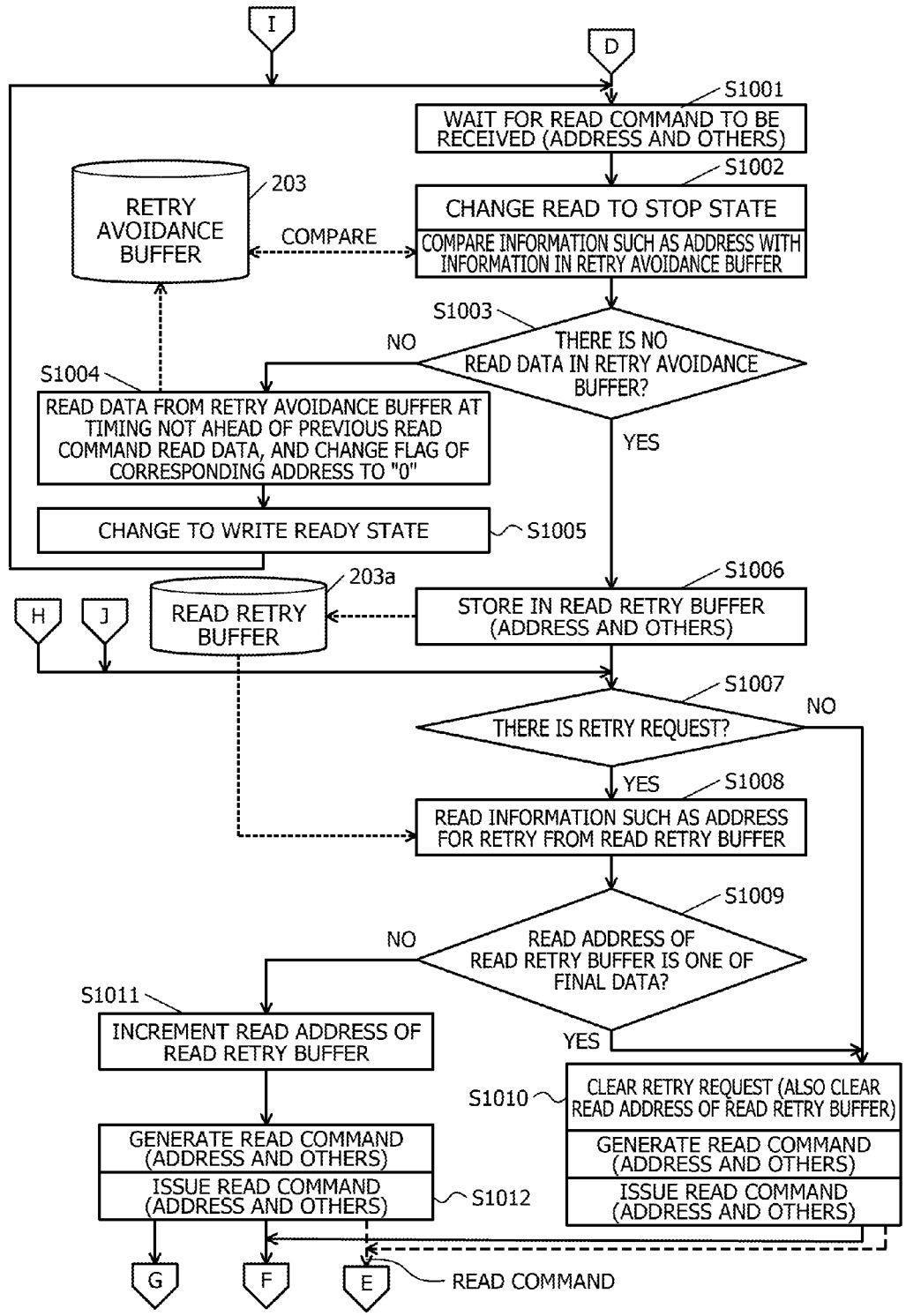
FIG. 10 is a flowchart illustrating a data processing content example in the transmission apparatus according to Embodiment 1 (Processing Part 2 during read)
Figure 11:
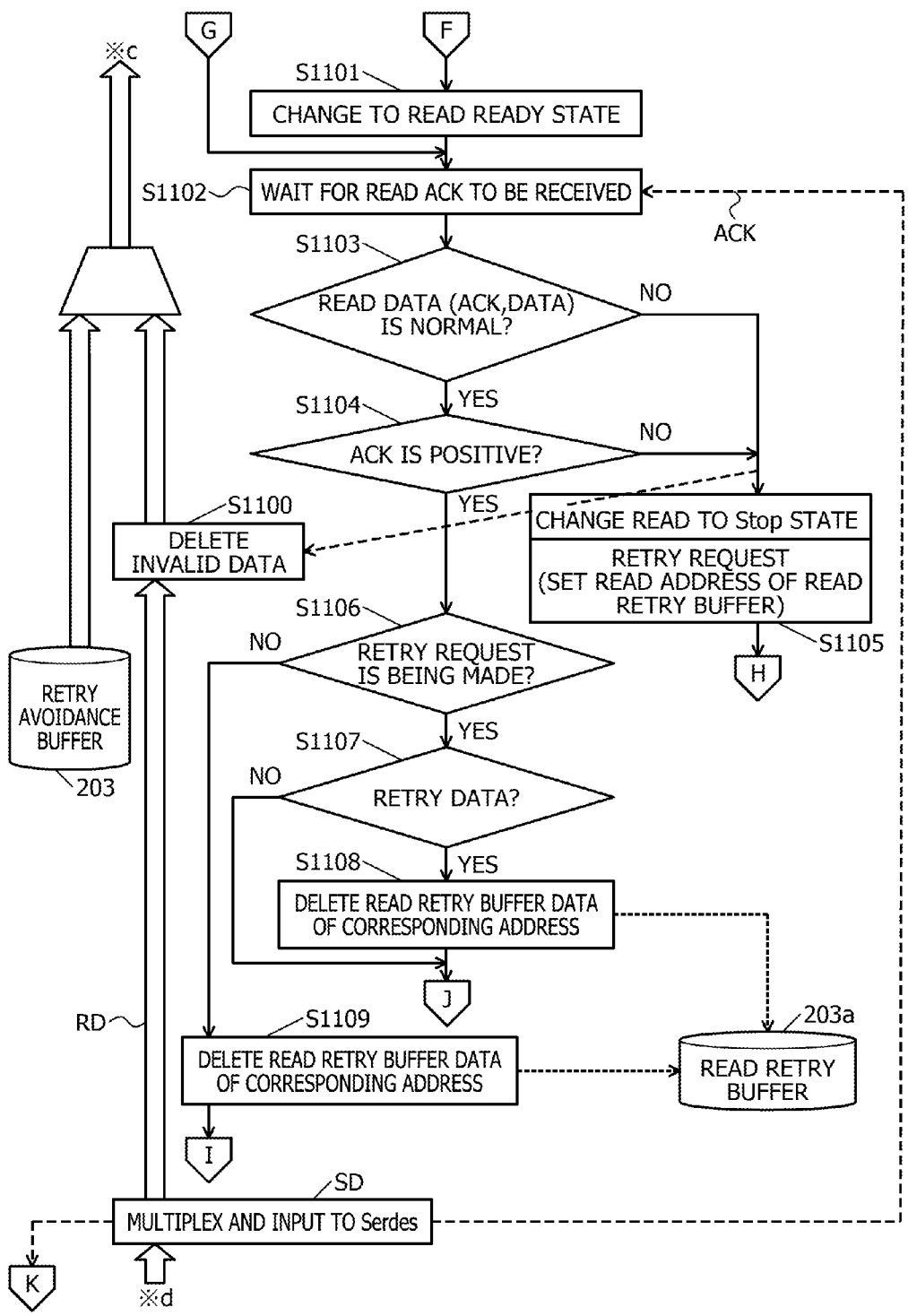
FIG. 11 is a flowchart illustrating a data processing content example in the transmission apparatus according to Embodiment 1 (Processing Part 3 during read)

After the processing by the user circuit (memory control unit 134) illustrated in FIG. 9 described above, the memory controller 135 executes processing illustrated in FIGS. 10 and 11. First, as illustrated in FIG. 10, the memory controller 135 waits for a read command (address and others) to be received (S1001).

Upon receipt of the read command, the memory controller 135 changes the read status flag from the retry avoidance buffer 203 to a Stop state. Also, the memory controller 135 compares information such as address in the received read command with information (address and others) in the retry avoidance buffer 203 (S1002).

Then, based on the comparison in S1002, the memory controller 135 checks if there is no read data RD in the retry avoidance buffer 203 (S1003). If there is read data RD in the retry avoidance buffer 203 (S1003: No), the memory controller 135 reads data from the retry avoidance buffer 203 at a timing not ahead of the read command read data. Also, the memory controller 135 changes the flag of address in the read data RD to "0" (S1004).

Thereafter, the memory controller 135 changes the status flag in the retry avoidance buffer 203 to the write ready state (S1005), and then returns to S1001.

On the other hand, if there is no read data RD in the retry avoidance buffer 203 (S1003: Yes), the memory controller 135 stores address and others of the read command in the read retry buffer 203a (S1006), and then moves to S1007.

In S1007, the memory controller 135 determines whether or not there is a retry request of the read command (S1007). The memory controller 135 moves to S1008 if there is the retry request of the read command (S1007: Yes), and moves to S1010 if there is no retry request of the read command (S1007: No).

In S1008, the memory controller 135 reads information such as address and others for retry from the read retry buffer 203a (S1008). Then, the memory controller 135 determines whether or not the read address from the read retry buffer 203a is one included in the final data (S1009).

If the read address from the read retry buffer 203a is the one included in the final data (S1009: Yes), the memory controller 135 clears the retry request. In this event, the memory controller 135 also clears the read address of the read retry buffer. Then, the memory controller 135 generates a read command (address and others) to the serial memory 141, and issues a read command (S1010).

On the other hand, if the read address from the read retry buffer 203a is not the one included in the final data (S1009: No), the memory controller 135 increments (+1) the read address of the read retry buffer (S1011). Then, the memory controller 135 generates a read command (address and others) to the serial memory 141, and issues a read command (S1012).

The memory controller 135 transmits the read commands issued in S1010 and S1012 to the serial memory 141 through the Serdes 135a on the memory controller 135 side (see SA in FIG. 7).

Next, as illustrated in FIG. 11, the memory controller 135 changes the read status flag of the retry avoidance buffer 203 to the ready state (S1101), and waits for a read ACK to be received from the serial memory 141 (S1102).

Then, the memory controller 135 determines whether or not the read data RD (ACK and data) read from the serial memory 141 is normal (S1103). If the read data is normal (S1103: Yes), the memory controller 135 determines whether or not the ACK is positive (S1104). If the ACK is positive (S1104: Yes), the memory controller 135 moves to S1106.

On the other hand, if the read data is not successfully read in S1103 (S1103: No), the memory controller 135 executes processing of S1105 and S1100. If the ACK is negative in S1104 (S1104: No), the memory controller 135 again executes the processing of S1105 and S1100.

The memory controller 135 changes the read status flag of the retry avoidance buffer 203 to the Stop state, and makes a retry request (S1105). In this retry request, a read address of the read retry buffer is set, and read data RD is read from the retry avoidance buffer 203. Meanwhile, in S1100, the read data RD from the serial memory 141 is deleted as invalid data (S1100).

In S1106, the memory controller 135 determines whether or not the retry request is being made (S1106). If the retry request is being made (S1106: Yes), the memory controller 135 determines whether or not the read data is retry data (S1107). On the other hand, if the retry request is not being made (S1106: No), the memory controller moves to S1109.

If the read data is the retry data in S1107 (S1107: Yes), the memory controller 135 deletes the data in the read retry buffer 203a of the corresponding address (S1108) and returns to S1007 in FIG. 10. On the other hand, if the read data is not the retry data in S1107 (S1107: No), the memory controller 135 returns to S1007 in FIG. 10.

In S1109, the memory controller 135 deletes the data in the read retry buffer 203a of the corresponding address (S1109) and returns to S1001 in FIG. 10.

The read data RD from the serial memory 141 is multiplexed with the read data RD illustrated in FIG. 11 and inputted to the Serdes 135a on the memory controller 135 side (SD). The memory controller 135 performs the processing illustrated in FIG. 11 to read the read data RD from the serial memory 141 or the retry avoidance buffer.

Figure 12:
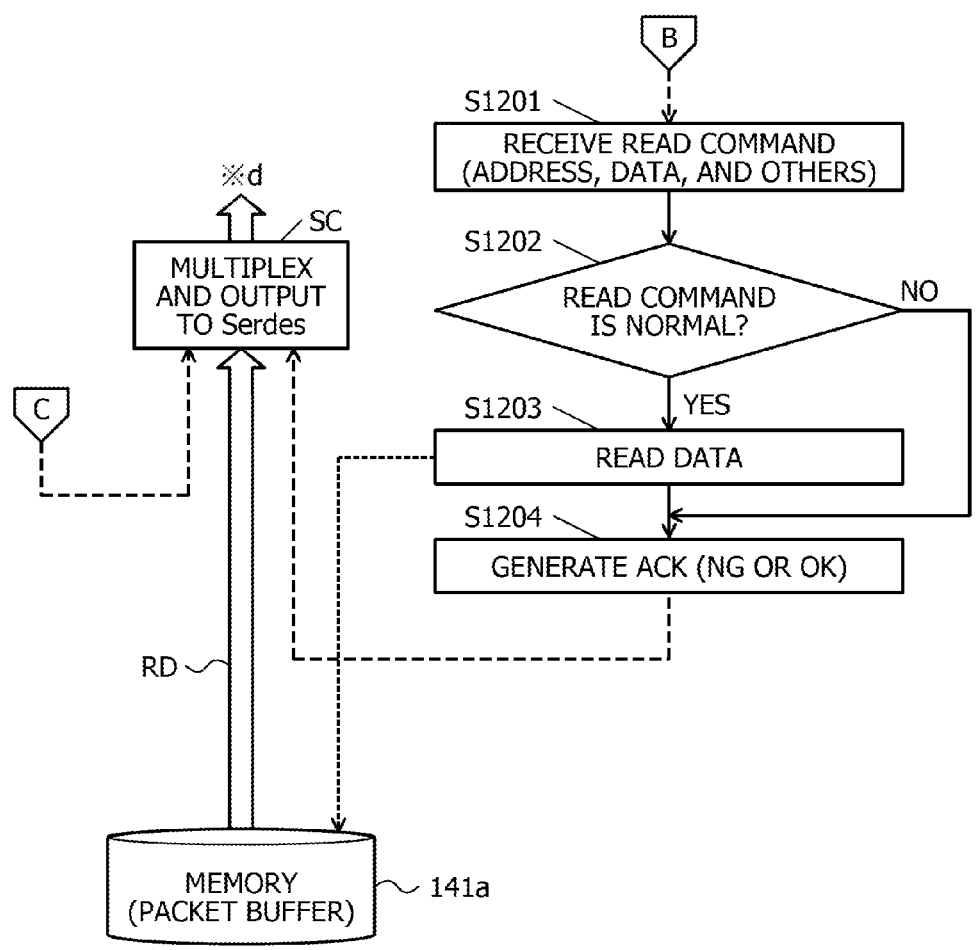
FIG. 12 is a flowchart illustrating a data processing content example in the transmission apparatus according to Embodiment 1 (Processing Part 4 during read)

After the processing by the memory controller 135 illustrated in FIG. 11 described above, the serial memory 141 executes processing illustrated in FIG. 12. First, the serial memory 141 receives a read command (address, data, and others) (S1201).

Then, the serial memory 141 determines whether or not the read command is normal (S1202). If the read command is normal (S1202: Yes), the serial memory 141 reads read data RD from the memory (packet buffer 141a) (S1203). Thereafter, the serial memory 141 generates an ACK (positive or negative) corresponding to a read status (S1204).

On the other hand, if the read command is not normal (S1202: No), the serial memory 141 generates a negative ACK (S1204) without performing the data read in S1203. The generated ACK is transmitted (multiplexed and outputted to the Serdes 135a: SC) to the memory controller 135 (for the processing of S1102 in FIG. 11).

According to Embodiment 1, data in which a write error has occurred during the write processing of the received packet into the serial memory is left in the retry avoidance buffer. Then, during the read processing, an address comparison is made to check if there is an address of data to be read is in the retry avoidance buffer. If the address is in the retry avoidance buffer, the same data may be read from the retry avoidance buffer without access (retry) to the serial memory.

The data read from the retry avoidance buffer is data in which a write error has occurred in the serial memory. Thus, a write retry to the serial memory in response to a data error occurring probabilistically in the Serdes may be reduced, making it possible to avoid occupancy of the communication band to the serial memory for an execution time of a write retry to the serial memory.

Such occupancy of the band occurs during a retry in a situation such as one where the existing transmission apparatus, for example, waits for next write access while accumulating data in the reception buffer, and eventually has an overflow of the reception buffer or the like with the result of making a request to stop data transmission or the like to the transmission-side processor.

In this regard, according to Embodiment 1, when a write error occurs in the serial memory, the same data is read from the retry avoidance buffer. Thus, even if the write error occurs in the serial memory, the write processing and the read processing may be both efficiently executed without any occupancy of the communication band to the serial memory.

Also, according to Embodiment 1, even if the write error occurs in the serial memory, no retry to the serial memory is performed. Thus, the occupancy of the communication band to the serial memory may be avoided. Moreover, an increase in power consumption of the transmission apparatus may be suppressed without the request to increase the transmission rate of a transceiver (Serdes) that is an IF with the serial memory in order to secure a band for a retry.

Embodiment 2

In Embodiment 2, description is given of a configuration example of avoiding a write access to the same bank during a read retry to the serial memory 141.

When the ReadData during the data read from the serial memory 141 described in Embodiment 1 is failed, there is data in the serial memory 141, and thus a read retry is unavoidable. In this event, the conflict settlement unit 134b settles a write access to the same bank in the serial memory 141, in which the read retry has been performed, thereby putting a write operation on standby. As a result, a write band is lost. Note that a write operation may be normally performed to a bank different from the bank in which the read retry has been performed.

Figure 13:
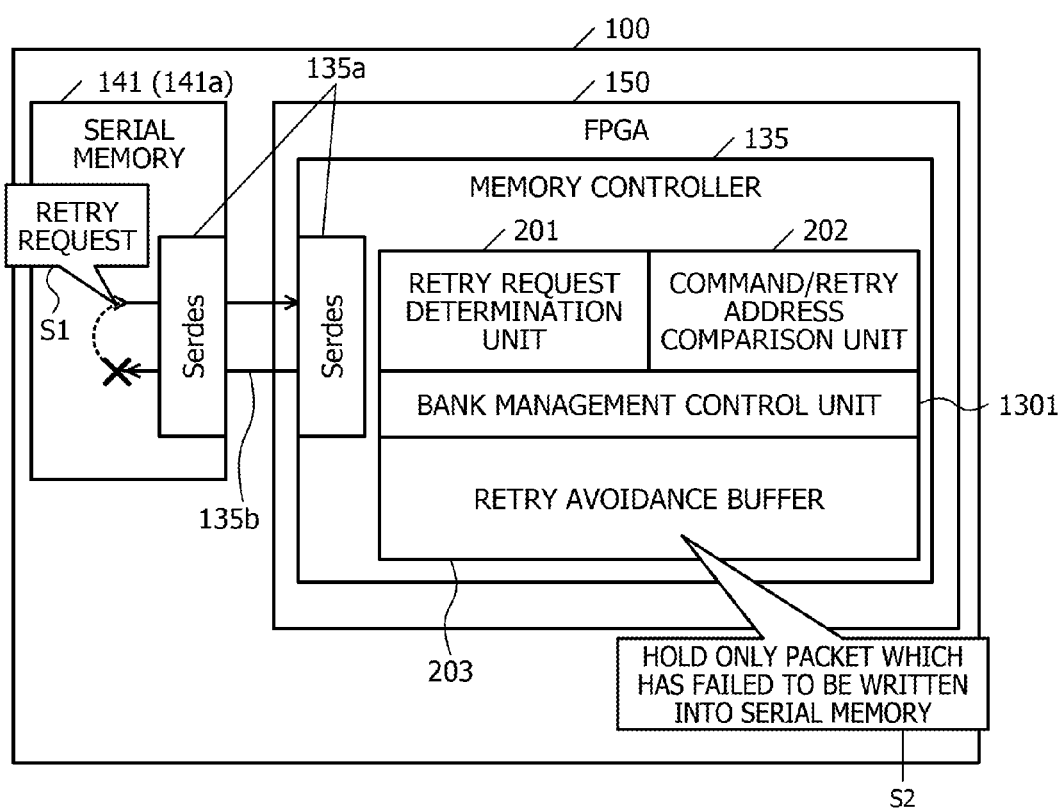
FIG. 13 is a diagram illustrating a configuration example of a memory controller part of a transmission apparatus according to Embodiment 2.

FIG. 13 is a diagram illustrating a configuration example of a memory controller part of a transmission apparatus according to Embodiment 2. The entire configuration (FIG. 1) is the same as that of Embodiment 1. As illustrated in FIG. 13, a function of a bank management control unit 1301 is added to the memory controller 135 (FIG. 2) described in Embodiment 1. The bank management control unit 1301 controls to avoid simultaneous read and write to the same banks in the serial memory 141.

Figure 14:
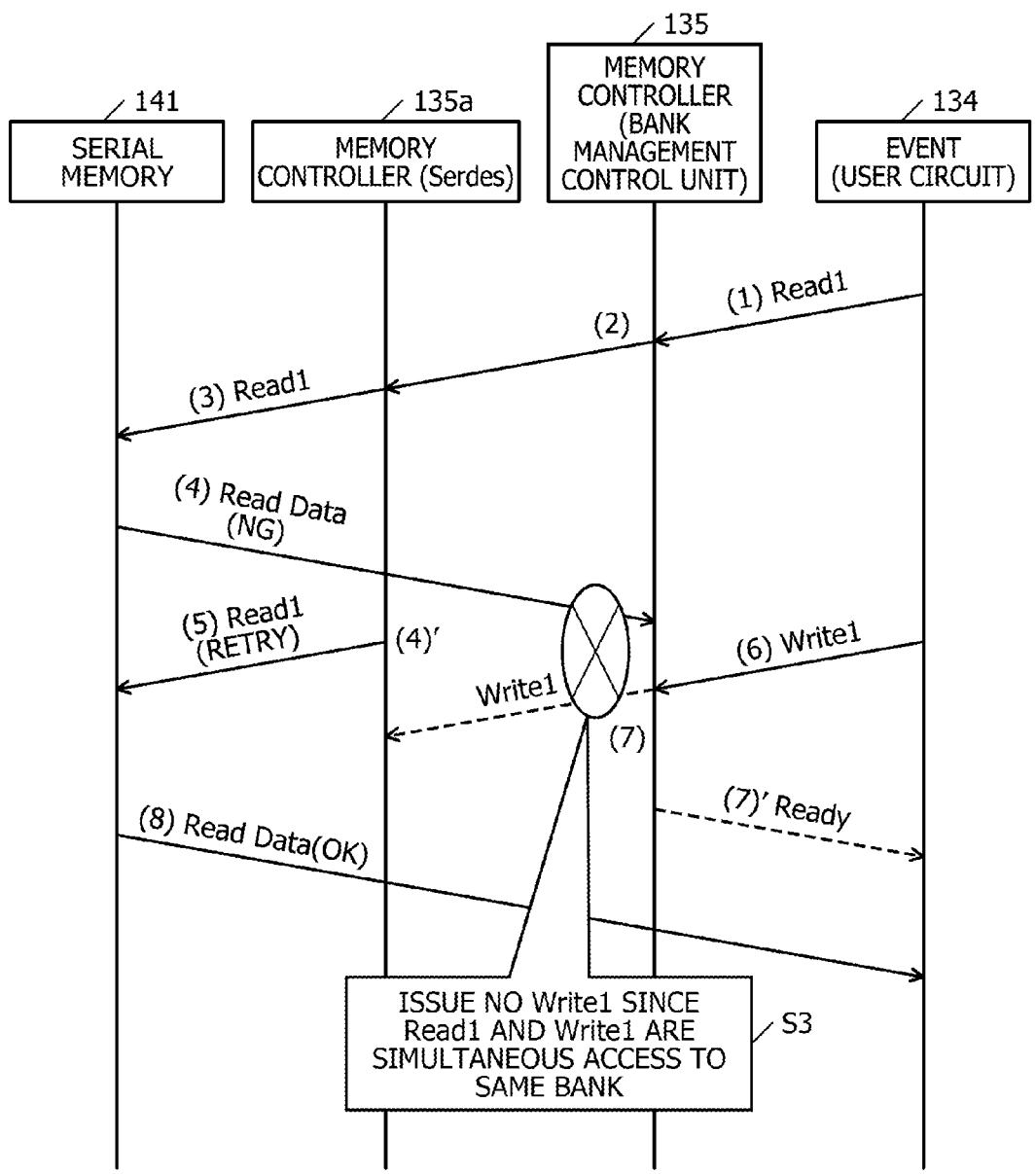
FIG. 14 is a sequence diagram illustrating a processing example of avoiding a write access to the same bank during a read retry in the transmission apparatus according to Embodiment 2.

FIG. 14 is a sequence diagram illustrating a processing example of avoiding a write access to the same bank during a read retry in the transmission apparatus according to Embodiment 2. The memory controller 135 and the serial memory 141 perform the following processing.

(1) A read request (Read1) issued as an event by the user circuit (memory control unit 134) is transmitted to the memory controller 135 and the Serdes 135a.

(2) The memory controller 135 compares a target address of Read1 with an address in the retry avoidance buffer 203.

(3) When the addresses do not correspond as a result of the comparison, the memory controller 135 issues Read1 to the serial memory 141.

(4) The serial memory 141 returns ReadData1. In this event, if ReadData is failed (uncorrectable data as a result of ECC), the serial memory 141 controls the memory controller 135 not to issue Write when a Write request arrives at the same bank as Read1.

(4)' The memory controller 135 checks if ReadData is failed.

(5) Since ReadData is failed, the memory controller 135 issues retry Read1 to the serial memory 141.

(6) It is assumed that a write request (Write1) is issued to the memory controller 135 from the user circuit at approximately the same timing as the retry Read1.

(7) In this case, the bank management control unit 1301 in the memory controller 135 determines whether or not Write1 is accessible. In other words, the bank management control unit 1301 determines if Write1 is access to the same bank as Read1. In the example of FIG. 14, since Read1 and Write1 are simultaneous access to the same bank, control is performed not to issue Write1 (S3). In this case, the memory controller 135 holds data WriteData of Write1 in the retry avoidance buffer 203.

(7)' The memory controller 135 permits access from the user circuit after waiting for a predetermined period of time (about access time of Write1) to pass.

(8) Thereafter, the memory controller 135 returns data (ReadData) of the retry Read1 from the serial memory 141 to the user circuit. Note that, when ReadData is OK (correctable data as a result of ECC) and after the data is returned to the user circuit, Write access to the same bank as Read1 may be processed.

(Processing Example During Data Write/Read)

In Embodiment 2, as in the case of Embodiment 1, data write processing (FIGS. 6 to 8) and read processing (FIGS. 9 to 12) are performed using the data processing content example illustrated in FIGS. 6 to 12.

Figure 15:
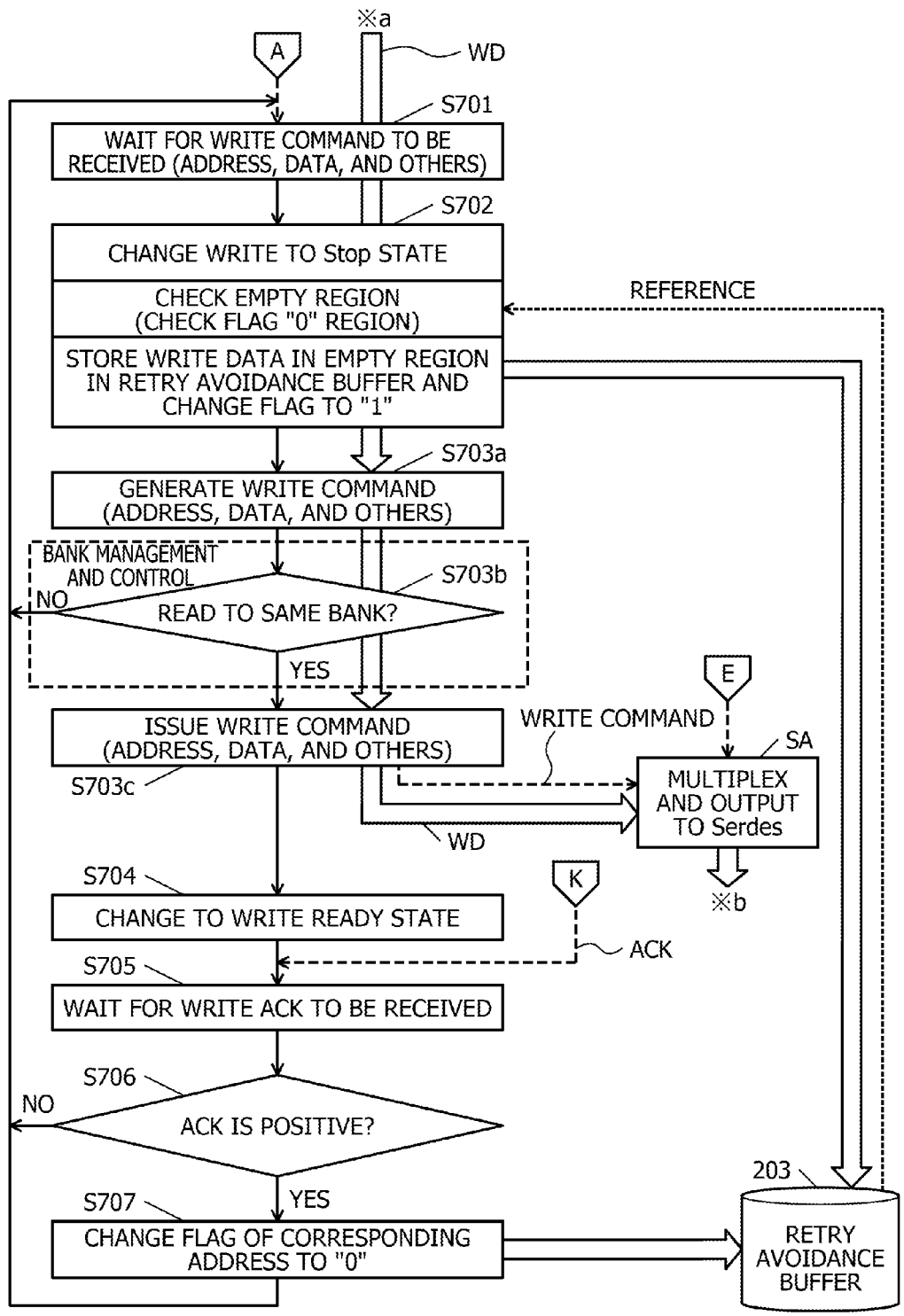
FIG. 15 is a flowchart illustrating a data processing content example in the transmission apparatus according to Embodiment 2.

FIG. 15 is a flowchart illustrating a data processing content example in the transmission apparatus according to Embodiment 2. In FIG. 15, some of the processing contents during data write are different from those of the processing in Embodiment 1 (FIG. 7). In FIG. 15, the same processing contents as those in FIG. 7 are denoted by the same reference numerals (numbers).

After the processing by the user circuit (memory control unit 134) illustrated in FIG. 6 described above, the memory controller 135 executes processing illustrated in FIG. 15. First, the memory controller 135 waits for a write command (address, data, and others) to be received (S701).

Upon receipt of the write command, the memory controller 135 changes the write status flag in the retry avoidance buffer 203 to a Stop state. Also, the memory controller 135 checks an empty region (region with the flag "0" in FIG. 3), stores write data WD in the empty region, and changes the flag of the region storing the write data to "1" (S702).

Next, the memory controller 135 generates a write command (address, data, and others) to the serial memory 141 (S703a).

Then, the bank management control unit 1301 in the memory controller 135 checks if there is no read access to the same bank in the serial memory 141 (S703b). If there is access to the same bank of write/read by a read retry or the like to the serial memory 141 (S703b: No), the bank management control unit 1301 stops issuance of a write command (S1010 and S1012 in FIG. 10). Thereafter, the processing returns to S701. On the other hand, if there is no access to the same bank of write/read (S703b: Yes), the memory controller 135 issues a write command without stopping the issuance thereof (S703c). Then, the write data WD is multiplexed and outputted to the Serdes 135a on the memory controller 135 side (SA).

Thereafter, the memory controller 135 changes the write status flag in the retry avoidance buffer 203 to the ready state (S704), and waits for a write ACK to be received from the serial memory 141 (S705).

Then, the memory controller 135 determines whether or not the write ACK received from the serial memory 141 is positive (S706). If the write ACK is positive (S706: Yes), the write of the write data WD into the serial memory 141 is successfully completed, and the flag of the corresponding address in the write data WD stored in the retry avoidance buffer 203 is changed to "0" (S707). Then, the processing returns to S701.

On the other hand, if the write ACK is not positive but is negative (S706: No), the processing returns to S701. In this case, the flag of the corresponding address in the write data WD in the retry avoidance buffer 203 remains as "1", and the write data WD is held in the retry avoidance buffer 203. After the processing by the memory controller 135 illustrated in FIG. 15 described above, the serial memory 141 executes processing illustrated in FIG. 8.

According to Embodiment 2, the same advantageous effect as that of Embodiment 1 may be achieved, and a write retry to the serial memory may be reduced in response to a data error occurring probabilistically in the Serdes. This makes it possible to avoid occupancy of the communication band to the serial memory for an execution time of a write retry to the serial memory.

Moreover, according to Embodiment 2, when a read retry occurs to the serial memory, write access to the same bank in which the read retry is being performed in the serial memory may be avoided. Note that the write data in this event may be stored in the retry avoidance buffer and write processing may be executed.

Embodiment 3

In Embodiment 3, description is given of a configuration example of an autonomous retry to write the data stored in the retry avoidance buffer 203 into the serial memory 141 by using blank time.

Figure 16:
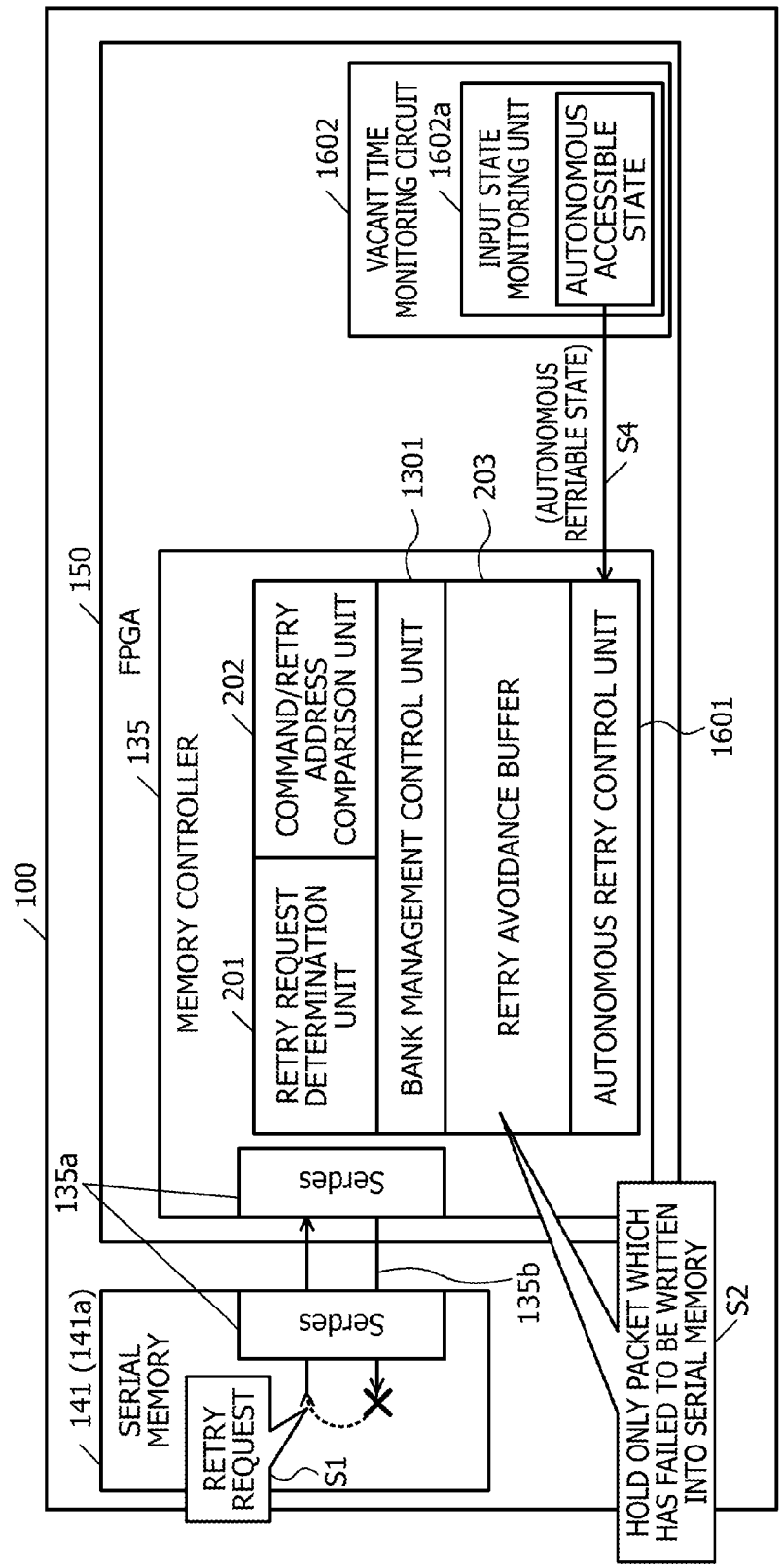
FIG. 16 is a diagram illustrating a configuration example of a memory controller part of a transmission apparatus according to Embodiment 3.

FIG. 16 is a diagram illustrating a configuration example of a memory controller part of a transmission apparatus according to Embodiment 3. The entire configuration (FIG. 1) is the same as that of Embodiment 1. As illustrated in FIG. 16, a function of an autonomous retry control unit 1601 is added to the memory controller 135 (FIG. 13) described in Embodiment 2. Also, a blank time monitoring circuit 1602 is provided outside the memory controller 135. The blank time monitoring circuit 1602 may be a part of the function of the reception unit 132 (see FIG. 1), for example.

The blank time monitoring circuit 1602 includes an input state monitoring unit 1602a to monitor an input state of a packet to the user circuit (or the memory controller 135). The input state monitoring unit 1602a outputs autonomous accessible state (autonomous retriable state) information (S4) to the autonomous retry control unit 1601 when a predetermined blank time is generated in an inputted packet.

Upon receipt of the autonomous retriable state information (S4), the autonomous retry control unit 1601 reads data stored in the retry avoidance buffer 203 and writes the data into the serial memory 141.

Figure 17:
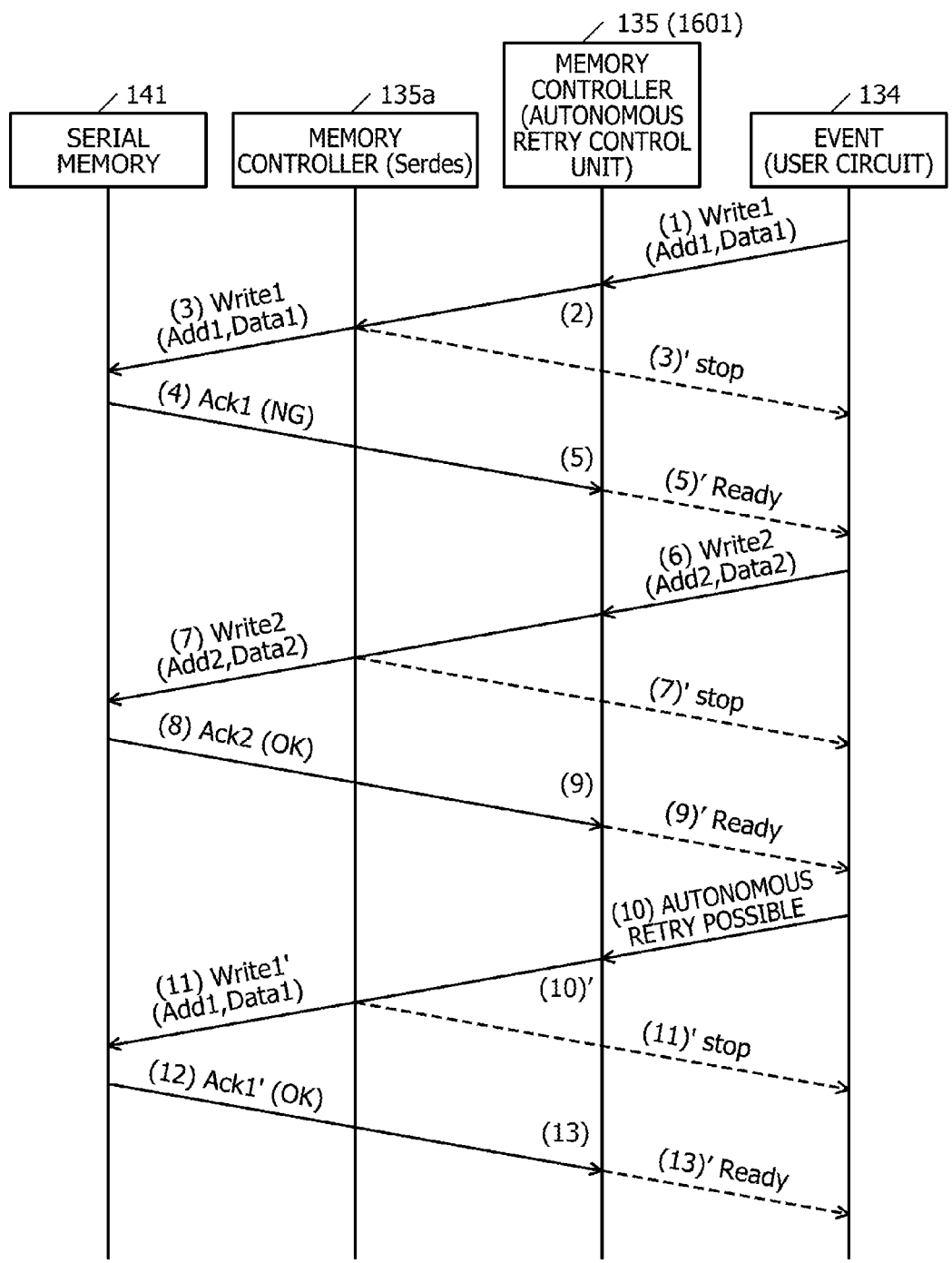
FIG. 17 is a sequence diagram illustrating an autonomous retry processing example in the transmission apparatus according to Embodiment 3.

FIG. 17 is a sequence diagram illustrating an autonomous retry processing example in the transmission apparatus according to Embodiment 3. The memory controller 135, the blank time monitoring circuit 1602, and the serial memory 141 perform the following processing.

(1) A write request (Write1) as an event is transmitted to the memory controller 135 and the Serdes 135a.

(2) The memory controller 135 stores an address (Add1) and data (Data1) of Write1 in the retry avoidance buffer 203.

(3) The memory controller 135 issues a write command (Write1) to the serial memory 141.

(3)' The memory controller 135 restricts (Stop) access to the user circuit 134.

(4) Here, write to the serial memory 141 is failed, write failure (Ack1 (NG)) is returned to the memory controller 135. The memory controller 135 sets up a flag indicating the Write failure of the corresponding data.

(5) The memory controller 135 holds the corresponding address (Add1) and data (Data1) in the retry avoidance buffer 203.

(5)' The memory controller 135 permits access to the user circuit 134 (ready).

(6) The user circuit 134 issues a write request (Write2, Add2, and Data2) to the memory controller 135.

(7) The memory controller 135 issues a write command (Write2) to the serial memory 141.

(7)' The memory controller 135 restricts (Stop) access to the user circuit 134.

(8) When the serial memory 141 has successfully performed the data write, Ack2 (positive) is returned to the memory controller 135.

(9) The memory controller 135 deletes the corresponding address and data (Add2 and Data2) and the like in the retry avoidance buffer 203.

(9)' The memory controller 135 permits access to the user circuit 134 (ready).

(10) Thereafter, when a blank time is generated as a result of monitoring a received packet by the input state monitoring unit 1602a in the blank time monitoring circuit 1602, the autonomous retriable state information S4 is notified to the autonomous retry control unit 1601 in the memory controller 135.

(10)' The autonomous retry control unit 1601 checks if there is data in the retry avoidance buffer 203. The autonomous retry control unit 1601 moves to (11) if there is data, and does not do anything if there is no data.

(11) The autonomous retry control unit 1601 issues a write request (Write1') and writes data into the serial memory 141.

(11)' The memory controller 135 restricts (Stop) access to the user circuit 134.

(12) The serial memory 141 returns Ack1' (positive) to the memory controller 135.

(13) The memory controller 135 deletes the corresponding address and data (Add1 and Data1) and the like in the retry avoidance buffer 203.

(13)' The memory controller 135 permits access to the user circuit 134 (ready).

Upon detection of a blank time, the input state monitoring unit 1602a in the blank time monitoring circuit 1602 performs the processing of (10) to (13)' described above. On the other hand, when no blank time is detected, the processing of (10) to (13)' is put on standby until there is an instruction from the user circuit 134.

(Processing Example During Data Write/Read)

Hereinafter, description is given of a processing example of adding the autonomous retry processing to the data write processing and read processing described in Embodiment 2.

Figure 18:
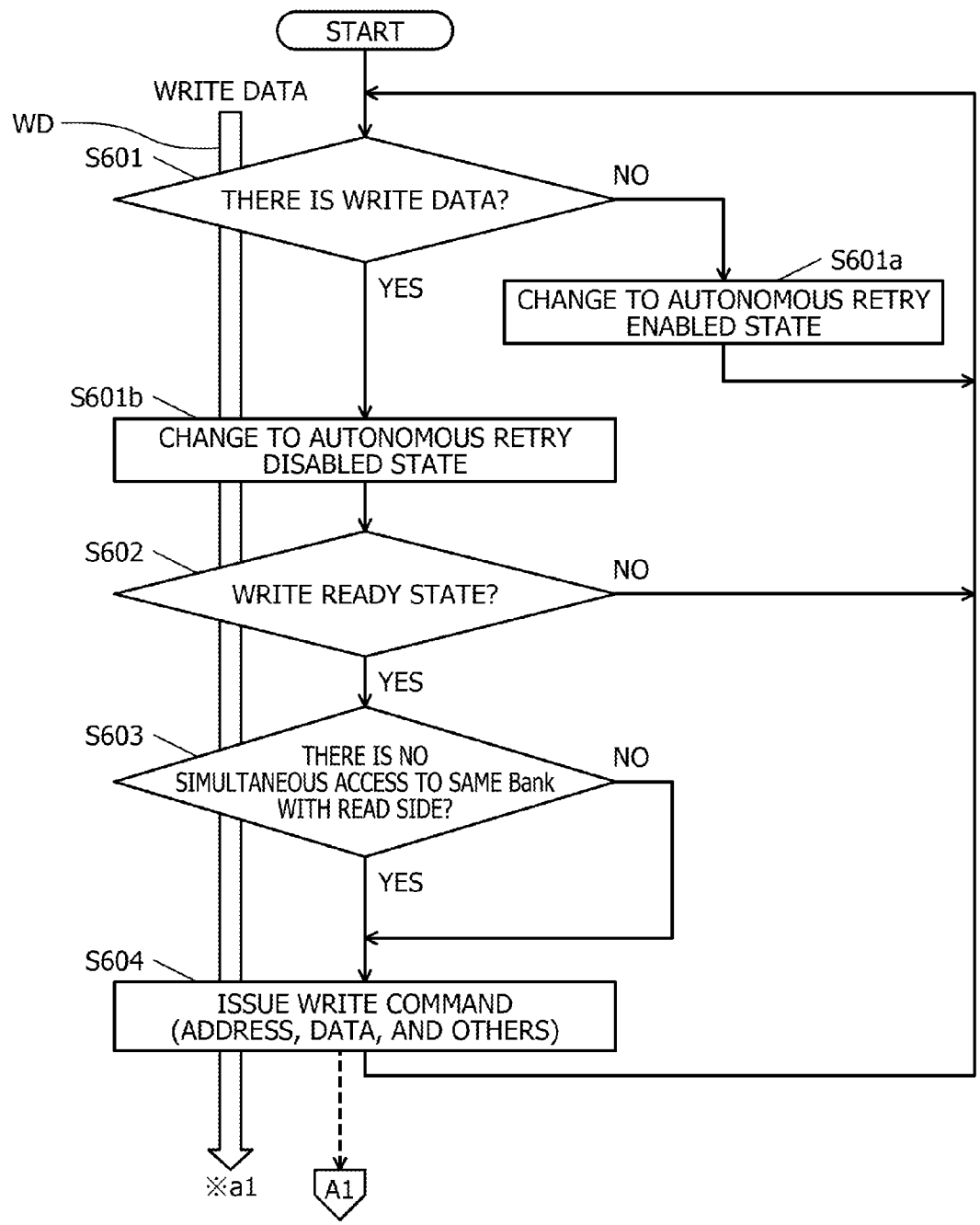
FIG. 18 is a flowchart illustrating a data processing content example in the transmission apparatus according to Embodiment 3 (Part 1)
Figure 19:
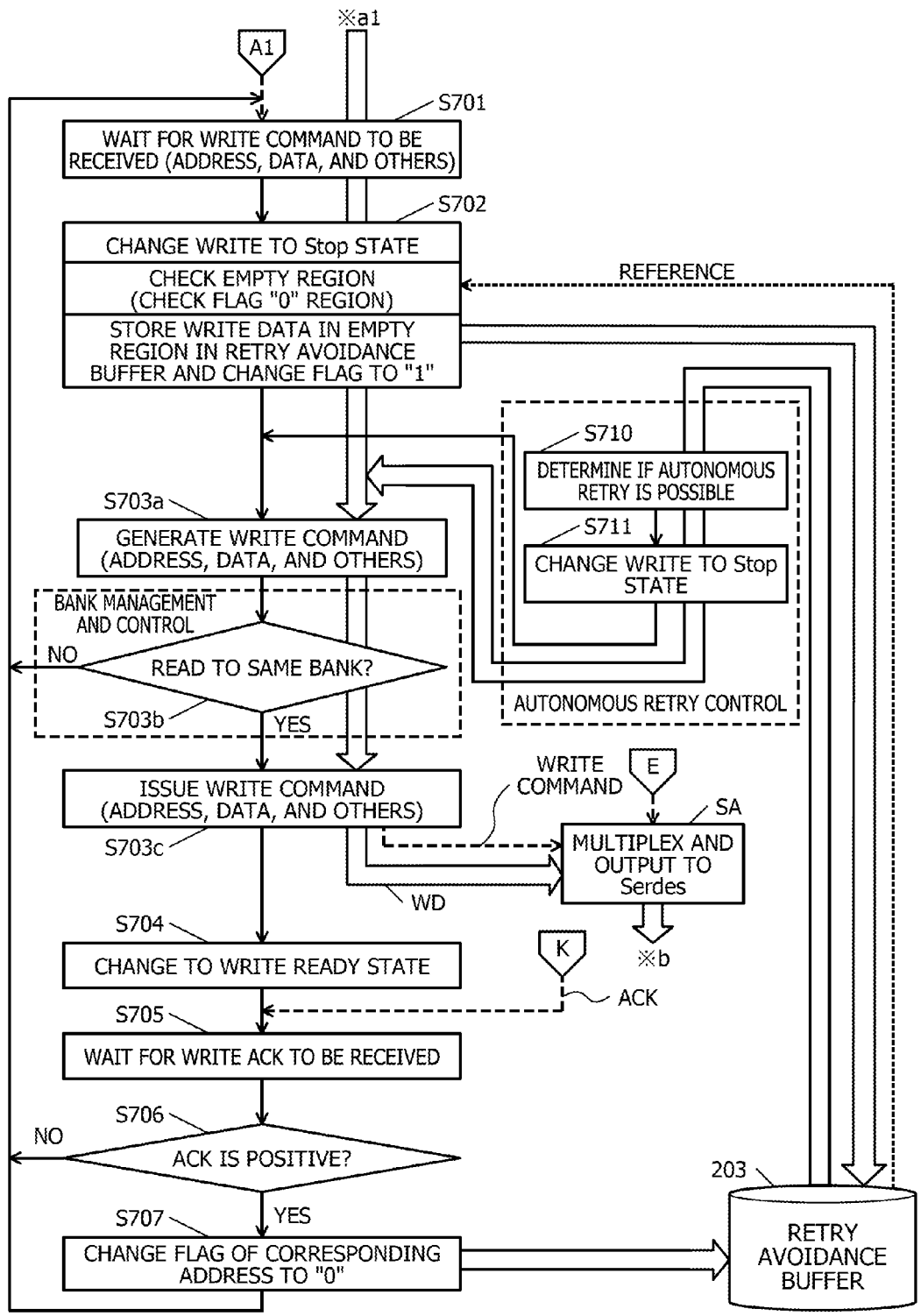
FIG. 19 is a flowchart illustrating a data processing content example in the transmission apparatus according to Embodiment 3 (Part 2)

FIGS. 18 and 19 are flowcharts each illustrating a data processing content example in the transmission apparatus according to Embodiment 3. In FIG. 18, some of the processing contents during data write are different from those of the processing in Embodiment 1 (FIG. 6).

First, in FIG. 18, the same processing contents as those in FIG. 6 are denoted by the same reference numerals (numbers). FIG. 18 illustrates processing performed by the memory control unit 134 that is the user circuit. The user circuit determines whether or not there is write data (S601).

If there is no write data (S601: No), the input state monitoring unit 1602a in the blank time monitoring circuit 1602 notifies the autonomous retry control unit 1601 in the memory controller 135 of information S2 of change to the autonomous retriable (enabled) state (S601a). Then, the processing returns to S601. On the other hand, if there is write data (S601: Yes), the input state monitoring unit 1602a in the blank time monitoring circuit 1602 notifies the autonomous retry control unit 1601 in the memory controller 135 of information S2 of the autonomous unretriable (disabled) state (S601b).

Next, the user circuit 134 determines, based on a status flag or the like in the retry avoidance buffer 203, whether the data may be written into the serial memory 141 (ready state) (S602).

If the data write is not in the ready state (S602: No), the processing returns to S601. On the other hand, if the data write is in the ready state (S602: Yes), the conflict settlement unit 134b determines if there is no simultaneous access to the same Bank with the read side (S603).

Here, the conflict settlement unit 134b is set to give priority to write processing over read processing. Thus, the processing moves to S604 in any case regardless of the determination result (S603: Yes/No) in S603.

In S604, the user circuit issues a write command (address, data, and others) (S604).

After the processing by the user circuit (memory control unit 134) illustrated in FIG. 18 described above, the memory controller 135 executes processing illustrated in FIG. 7. Processing illustrated in FIG. 19 includes the processing (bank management control) according to Embodiment 2 (FIG. 15). First, the memory controller 135 waits for a write command (address, data, and others) to be received (S701).

Upon receipt of the write command, the memory controller 135 changes the write status flag in the retry avoidance buffer 203 to a Stop state. Also, the memory controller 135 checks an empty region (region with the flag "0" in FIG. 3), stores write data WD in the empty region, and changes the flag of the region storing the write data to "1" (S702).

Next, the memory controller 135 generates a write command (address, data, and others) to the serial memory 141 (S703a).

Then, the bank management control unit 1301 in the memory controller 135 checks if there is no read access to the same bank in the serial memory 141 (S703b). If there is access to the same bank of write/read by a read retry or the like to the serial memory 141 (S703b: No), the bank management control unit 1301 stops issuance of a write command (S1010 and S1012 in FIG. 10). Thereafter, the processing returns to S701. On the other hand, if there is no access to the same bank of write/read (S703b: Yes), the memory controller 135 issues a write command without stopping the issuance thereof (S703c). Then, the write data WD is multiplexed and outputted to the Serdes 135a on the memory controller 135 side (SA).

Thereafter, the memory controller 135 changes the write status flag in the retry avoidance buffer 203 to the ready state (S704), and waits for a write ACK to be received from the serial memory 141 (S705).

Then, the memory controller 135 determines whether or not the write ACK received from the serial memory 141 is positive (S706). If the write ACK is positive (S706: Yes), the write of the write data WD into the serial memory 141 is successfully completed, and the flag of the corresponding address in the write data WD stored in the retry avoidance buffer 203 is changed to "0" (S707). Then, the processing returns to S701.

On the other hand, if the write ACK is not positive but is negative (S706: No), the processing returns to S701. In this case, the flag of the corresponding address in the write data WD in the retry avoidance buffer 203 remains as "1", and the write data WD is held in the retry avoidance buffer 203. After the processing by the memory controller 135 illustrated in FIG. 19 described above, the serial memory 141 executes the processing illustrated in FIG. 8.

Then, in Embodiment 3, processing of determining whether or not an autonomous retry is possible (S710) is additionally performed. In this processing, the blank time monitoring circuit 1602 in the user circuit 134 determines an autonomous retriable state (enabled/disabled) by monitoring, with a flag, the autonomous retriable state and whether or not there is data in the retry avoidance buffer 203. If the autonomous retry is possible, the write is changed to the Stop state (S711), and data is read from the retry avoidance buffer 203 to execute the processing of S703a.

Figure 20:
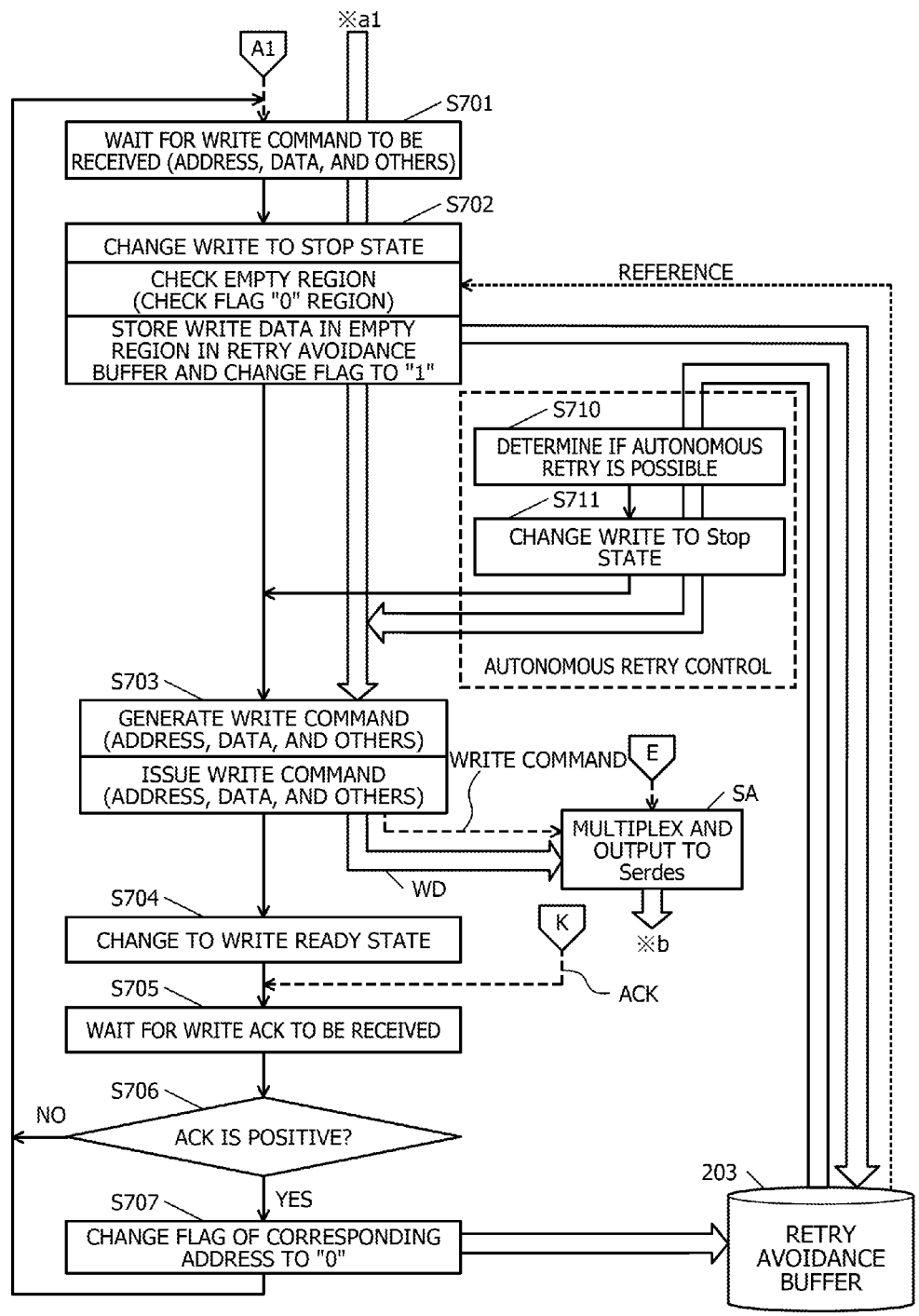
FIG. 20 is a flowchart illustrating another data processing content example in the transmission apparatus according to Embodiment 3.

FIG. 20 is a flowchart illustrating another data processing content example in the transmission apparatus according to Embodiment 3. The processing example of FIG. 19 includes the processing according to Embodiments 1 and 2. Meanwhile, FIG. 20 illustrates a processing example of adding the processing according to Embodiment 3 (autonomous retry) to Embodiment 1 while omitting the processing according to Embodiment 2 (the same bank control).

After the processing illustrated in FIG. 18, the memory controller 135 executes the processing illustrated in FIG. 19 and waits for a write command (address, data, and others) to be received (S701).

Upon receipt of the write command, the memory controller 135 changes the write status flag in the retry avoidance buffer 203 to a Stop state. Also, the memory controller 135 checks an empty region (region with the flag "0" in FIG. 3), stores write data WD in the empty region, and changes the flag of the region storing the write data to "1" (S702).

Next, the memory controller 135 generates a write command (address, data, and others) to the serial memory 141, and issues the write command (S703). Thus, the write data WD is multiplexed and outputted to the Serdes 135a on the memory controller 135 side (SA).

Thereafter, the memory controller 135 changes the write status flag in the retry avoidance buffer 203 to a ready state (S704), and waits for a write ACK to be received from the serial memory 141 (S705).

Then, the memory controller 135 determines whether or not the write ACK received from the serial memory 141 is positive (S706). If the write ACK is positive (S706: Yes), the write of the write data WD into the serial memory 141 is successfully completed, and the flag of the corresponding address in the write data WD stored in the retry avoidance buffer 203 is changed to "0" (S707). Then, the processing returns to S701.

On the other hand, if the write ACK is not positive but is negative (S706: No), the processing returns to S701. In this case, the flag of the corresponding address in the write data WD in the retry avoidance buffer 203 remains as "1", and the write data WD is held in the retry avoidance buffer 203. After the processing by the memory controller 135 illustrated in FIG. 20 described above, the serial memory 141 executes the processing illustrated in FIG. 8.

Then, in FIG. 20, processing of determining whether or not an autonomous retry is possible (S710) is additionally performed. In this processing, the blank time monitoring circuit 1602 in the user circuit 134 determines an autonomous retriable state (enabled/disabled) by monitoring, with a flag, the autonomous retriable state and whether or not there is data in the retry avoidance buffer 203. If the autonomous retry is possible, the write is changed to the Stop state (S711), and data is read from the retry avoidance buffer 203 to execute the processing of S703.

According to Embodiment 3, the same advantageous effect as that of Embodiment 1 may be achieved, and a write retry to the serial memory may be reduced in response to a data error occurring probabilistically in the Serdes. This makes it possible to avoid occupancy of the communication band to the serial memory for an execution time of a write retry to the serial memory.

Moreover, according to Embodiment 3, the same advantageous effect as that of Embodiment 2 may be achieved, and when a read retry occurs to the serial memory, write access to the same bank in which the read retry is being performed in the serial memory may be avoided. Note that the write data in this event may be stored in the retry avoidance buffer and write processing may be executed.

In Embodiments 1 and 2 described above, the serial memory 141 is used as a memory (packet buffer 141a) from which packets are read upon elapse of a certain period of time after the packets are written, even though the read order changes according to the priority. In Embodiment 3, the data stored in the retry avoidance buffer 203 is written into the serial memory 141 by the autonomous retry. Thus, an increase in capacity of the retry avoidance buffer 203 is not requested. Moreover, the condition of the serial memory 141 as the packet buffer 141a may be eased or canceled.

FIG. 21 is a sequence diagram illustrating a state of band occupancy in an existing transmission apparatus. Hereinafter, description is given of processing upon failure of data write to the serial memory 141 in the existing transmission apparatus including no retry avoidance buffer 203.

(1) A write request (Write1) as an event is transmitted to the memory controller 135 (and the Serdes 135a).

(2) The memory controller 135 issues a write command (Write1) to the serial memory 141.

(2)' The memory controller 135 restricts (Stop) access to the user circuit 134.

(3) When the data write fails, the serial memory 141 returns write failure (Ack1 (NG)) to the memory controller 135.

(4) The memory controller 135 retries the write (Write1) to the serial memory 141.

(5) When the data write is successfully performed, the serial memory 141 returns Ack1 (positive) to the memory controller 135.

(5)' The memory controller 135 permits access to the user circuit 134 (ready).

(6) Then, the memory controller 135 permits access (read request in the example of FIG. 21).

In the existing processing described above, the memory controller 135 retries the write to the serial memory 141 due to failure that probabilistically occurs during the data write to the serial memory 141. Thus, in the existing transmission apparatus, next access is put on standby during a period T requested for a retry, and causes occupancy of the communication band to the serial memory 141. When the reception buffer 131 becomes full, a request to stop packet transmission is made to the previous transmission apparatus which transmits packets. Thus, when failure of data write probabilistically occurs in the serial memory 141, the communication band to the serial memory 141 is occupied.

On the other hand, according to the respective embodiments, as illustrated in FIG. 4 and the like, even if failure of data write probabilistically occurs, the data is stored in the retry avoidance buffer 203 by using the high-speed serial memory 141. Thus, the data may be read from the retry avoidance buffer 203 without performing a retry to the serial memory 141. Since a write retry to the serial memory 141 is reduced, the occupancy of the communication band of the serial memory 141 may be reduced. Thus, the write processing and read processing may be both efficiently performed.

Moreover, since no retry to the serial memory 141 is performed, an increase in transmission rate of a transceiver (Serdes or the like) that is an IF with the serial memory in order to occupy a band for a retry is not requested. As a result, an increase in power consumption of the transmission apparatus may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission apparatus comprising:
a first storage configured to store data received from external into a write enable area;
a second storage configured to store the data in accordance with a write request and output a retry request in response to occurring an error of writing a first data included in the data; and
a controller configured to read the data from the first storage and send the write request to the second storage, set an area of the first storage storing the first data to a write disable area in combination with stop sending the retry request to external when receiving the retry request from the second storage, and send the first data reading from the write disable area of the first storage to external in response to a read request from external.

2. The transmission apparatus according to claim 1, wherein the storage is a serial memory and stores the data through an interface in which an error occurs with a predetermined probability.

3. The transmission apparatus according to claim 1, wherein
the controller set an area corresponding to the data stored in the first storage to the write enable area when the data is successfully written into the second storage, and
when receiving the write request form external, the controller writes a requested data to the write enable area of the first storage.

4. The transmission apparatus according to claim 1, wherein
the second storage includes a plurality of banks, and
when a conflict occurs between access for read and access for write to the same bank among the plurality of banks in the second storage, the controller stores a data to be written in the access for write in the first storage.

5. The transmission apparatus according to claim 4, wherein the access for read is read access during a retry to be executed due to a read error of the data from the second storage.

6. The transmission apparatus according to claim 4, wherein the controller permits the access for write to the same bank in the second storage after the elapse of a predetermined period of time since the occurrence of the conflict.

7. The transmission apparatus according to claim 1, further comprising:

a monitoring circuit configured to monitor a blank time between write data outputted to the controller, wherein
based on input of information indicating detection of the blank time from the monitoring circuit, the controller uses the blank time to write the data and the address information corresponding to the data stored in the first storage into the second storage.

8. The transmission apparatus according to claim 7, wherein the monitoring circuit monitors a blank time between the data received.

9. The transmission apparatus according to claim 1, wherein after reading the data from the first storage, the controller sets an area of the read data to the write enable area.

10. A retry method executed by a transmission apparatus including a first storage configured to store data received from external into a write enable area and a second storage configured to store the data in accordance with a write request and output a retry request in response to occurring an error of writing a first data included in the data, comprising:
reading the data from the first storage and send the write request to the second storage;
setting an area of the first storage storing the first data to a write disable area in combination with stop sending the retry request to external when receiving the retry request from the second storage; and
sending the first data reading from the write disable area of the first storage to external in response to a read request from external.

* * * * *